United States Patent
Ren et al.

(10) Patent No.: US 10,141,160 B2
(45) Date of Patent: Nov. 27, 2018

(54) APPARATUS OF PLURAL CHARGED-PARTICLE BEAMS

(71) Applicant: Hermes Microvision Inc., Hsinchu (TW)

(72) Inventors: Weiming Ren, San Jose, CA (US); Xuedong Liu, San Jose, CA (US); Xuerang Hu, San Jose, CA (US); Zhongwei Chen, San Jose, CA (US)

(73) Assignee: HERMES MICROVISION, INC., Hsinchu (TW)

( * ) Notice: Subject to any disclaimer, the term of this patent is extended or adjusted under 35 U.S.C. 154(b) by 0 days.

(21) Appl. No.: 15/365,145

(22) Filed: Nov. 30, 2016

(65) Prior Publication Data
US 2017/0154756 A1    Jun. 1, 2017

Related U.S. Application Data

(60) Provisional application No. 62/260,822, filed on Nov. 30, 2015.

(51) Int. Cl.
*H01J 37/28*    (2006.01)
*H01J 37/14*    (2006.01)
(Continued)

(52) U.S. Cl.
CPC .............. *H01J 37/28* (2013.01); *H01J 37/14* (2013.01); *H01J 37/141* (2013.01);
(Continued)

(58) Field of Classification Search
CPC ........ H01J 37/28; H01J 37/244; H01J 37/141; H01J 37/1472; H01J 37/153; H01J 37/20;
(Continued)

(56) References Cited

U.S. PATENT DOCUMENTS 5,602,679 A * 2/1997 Dolgoff .............. G02F 1/133382
                                                    345/32
6,653,632 B2   11/2003 Kazumori
(Continued)

OTHER PUBLICATIONS

Weiming Ren et al., U.S. Appl. No. 15/065,342, filed Mar. 9, 2016.
(Continued)

*Primary Examiner* — David A Vanore
(74) *Attorney, Agent, or Firm* — Finnegan, Henderson, Farabow, Garrett & Dunner, LLP

(57) ABSTRACT

A secondary projection imaging system in a multi-beam apparatus is proposed, which makes the secondary electron detection with high collection efficiency and low cross-talk. The system employs one zoom lens, one projection lens and one anti-scanning deflection unit. The zoom lens and the projection lens respectively perform the zoom function and the anti-rotating function to remain the total imaging magnification and the total image rotation with respect to the landing energies and/or the currents of the plural primary beamlets. The anti-scanning deflection unit performs the anti-scanning function to eliminate the dynamic image displacement due to the deflection scanning of the plural primary beamlets.

76 Claims, 24 Drawing Sheets

(51) Int. Cl.
*H01J 37/153* (2006.01)
*H01J 37/20* (2006.01)
*H01J 37/244* (2006.01)
*H01J 37/141* (2006.01)
*H01J 37/29* (2006.01)

(52) U.S. Cl.
CPC ............ *H01J 37/153* (2013.01); *H01J 37/20* (2013.01); *H01J 37/244* (2013.01); *H01J 37/292* (2013.01); *H01J 2237/0453* (2013.01); *H01J 2237/1532* (2013.01); *H01J 2237/24465* (2013.01); *H01J 2237/24592* (2013.01); *H01J 2237/2806* (2013.01); *H01J 2237/2817* (2013.01)

(58) Field of Classification Search
CPC .......... H01J 37/05; H01J 37/06; H01J 37/073; H01J 37/09; H01J 37/147; H01J 37/185; H01J 37/222; H01J 37/3174; H01J 27/04; H01J 37/063; H01J 37/14; H01J 37/145; H01J 37/1474; H01J 37/26; H01J 37/265; H01J 37/3177; G01N 23/2251; G01N 23/225; G01N 23/22
USPC ............ 250/310, 311, 396 R, 398, 397, 307, 250/396 ML, 306, 492.2, 492.3, 492.1
See application file for complete search history.

(56) References Cited

U.S. PATENT DOCUMENTS

| | | | |
|---|---|---|---|
| 6,809,322 B2 | 10/2004 | Danilatos | |
| 6,855,929 B2* | 2/2005 | Kimba | G01N 23/225 250/307 |
| 6,943,349 B2 | 9/2005 | Adamec et al. | |
| 7,244,949 B2 | 7/2007 | Knippelmeyer et al. | |
| 7,335,894 B2* | 2/2008 | Frosien | H01J 37/05 250/310 |
| 7,423,268 B2 | 9/2008 | Ren | |
| 7,880,143 B2* | 2/2011 | Tanimoto | H01J 37/244 250/306 |
| 7,906,761 B2* | 3/2011 | Tanimoto | G01N 23/225 250/306 |
| 7,906,762 B2 | 3/2011 | Bierhoff et al. | |
| 8,035,082 B2* | 10/2011 | Yamazaki | G01N 23/2251 250/310 |
| 8,294,095 B2* | 10/2012 | Chen | G01N 23/2251 250/310 |
| 8,330,103 B2* | 12/2012 | Enyama | H01J 37/28 250/306 |
| 8,445,862 B2* | 5/2013 | Chen | H01J 37/141 250/396 ML |
| 8,723,117 B2* | 5/2014 | Lanio | H01J 37/09 250/310 |
| 9,035,249 B1* | 5/2015 | Frosien | H01J 37/05 250/310 |
| 9,607,805 B2* | 3/2017 | Liu | H01J 37/28 |
| 9,691,586 B2* | 6/2017 | Ren | H01J 37/28 |
| 9,691,588 B2* | 6/2017 | Ren | H01J 37/28 |
| 2002/0109090 A1* | 8/2002 | Nakasuji | B82Y 10/00 250/311 |
| 2003/0085360 A1* | 5/2003 | Parker | B82Y 10/00 250/396 R |
| 2006/0016989 A1* | 1/2006 | Nakasuji | G01N 23/2251 250/310 |
| 2009/0014649 A1* | 1/2009 | Nakasuji | H01J 37/153 250/310 |
| 2009/0218506 A1* | 9/2009 | Nakasuji | H01J 37/05 250/396 ML |
| 2012/0145900 A1* | 6/2012 | Chen | G01N 23/2251 250/311 |
| 2015/0060662 A1* | 3/2015 | Chen | H01J 37/145 250/307 |
| 2016/0268096 A1* | 9/2016 | Ren | H01J 37/28 |
| 2017/0154756 A1* | 6/2017 | Ren | H01J 37/14 |

OTHER PUBLICATIONS

Weiming Ren et al., U.S. Appl. No. 15/078,369, filed Mar. 23, 2016.
Xuedong Liu et al., U.S. Appl. No. 15/150,858, filed May 10, 2016.
Shuai Li et al., U.S. Appl. No. 15/213,781, filed Jul. 19, 2016.
Weiming Ren et al., U.S. Appl. No. 15/216,258, filed Jul. 21, 2016.
International Search Report and Written Opinion issued by the Patent Cooperation Treaty dated Feb. 15, 2017, for application No. PCT/US16/64195.

* cited by examiner

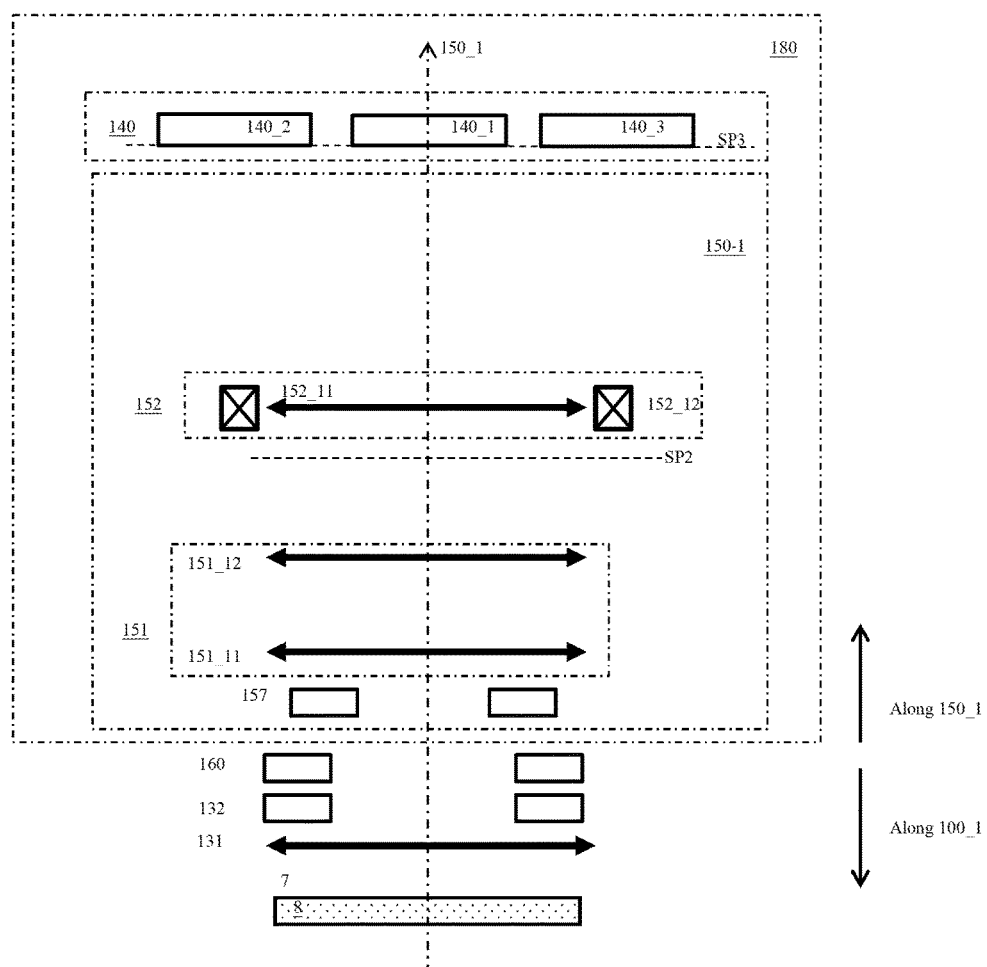
Figure 2 (Invention)

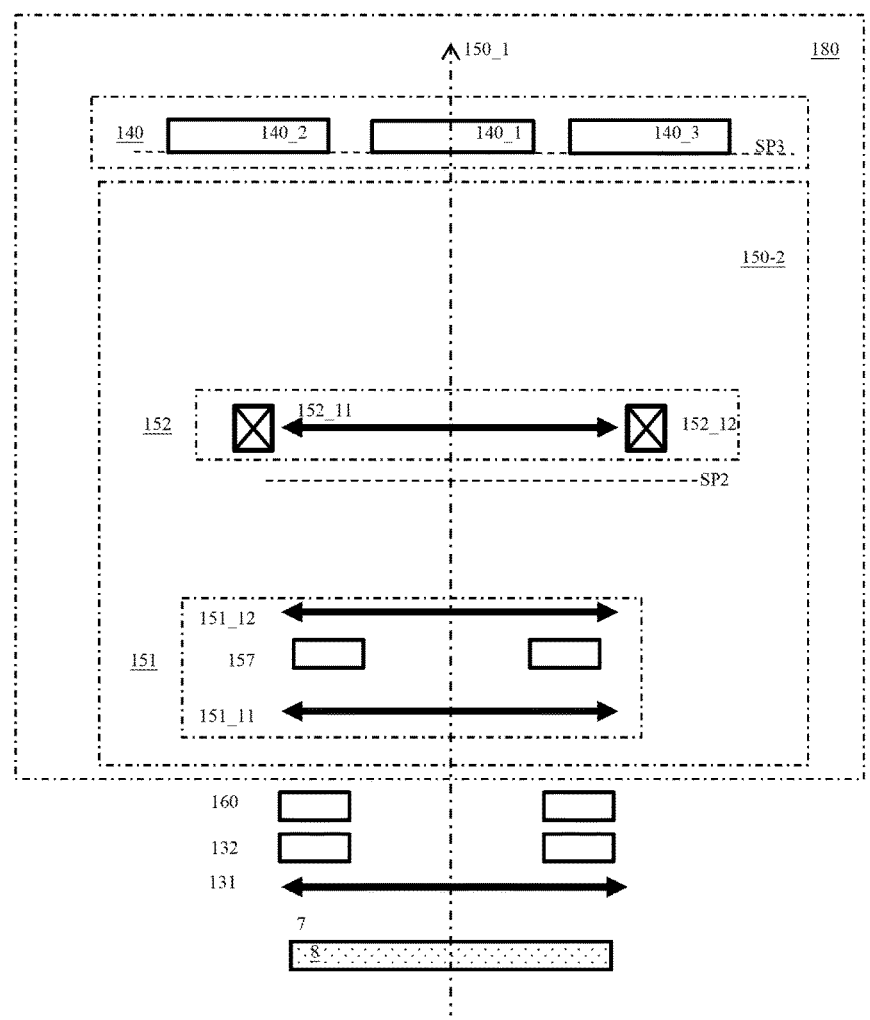
Figure 3A (Invention)

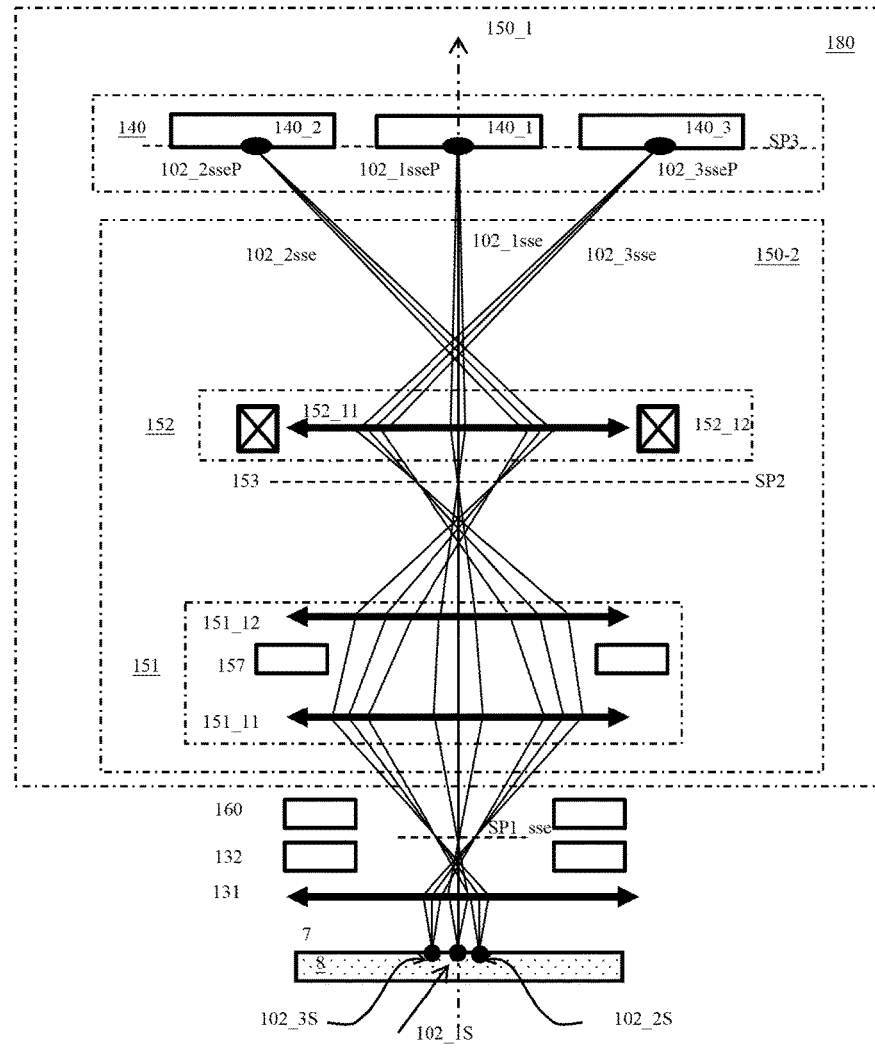
Figure 3B (Invention)

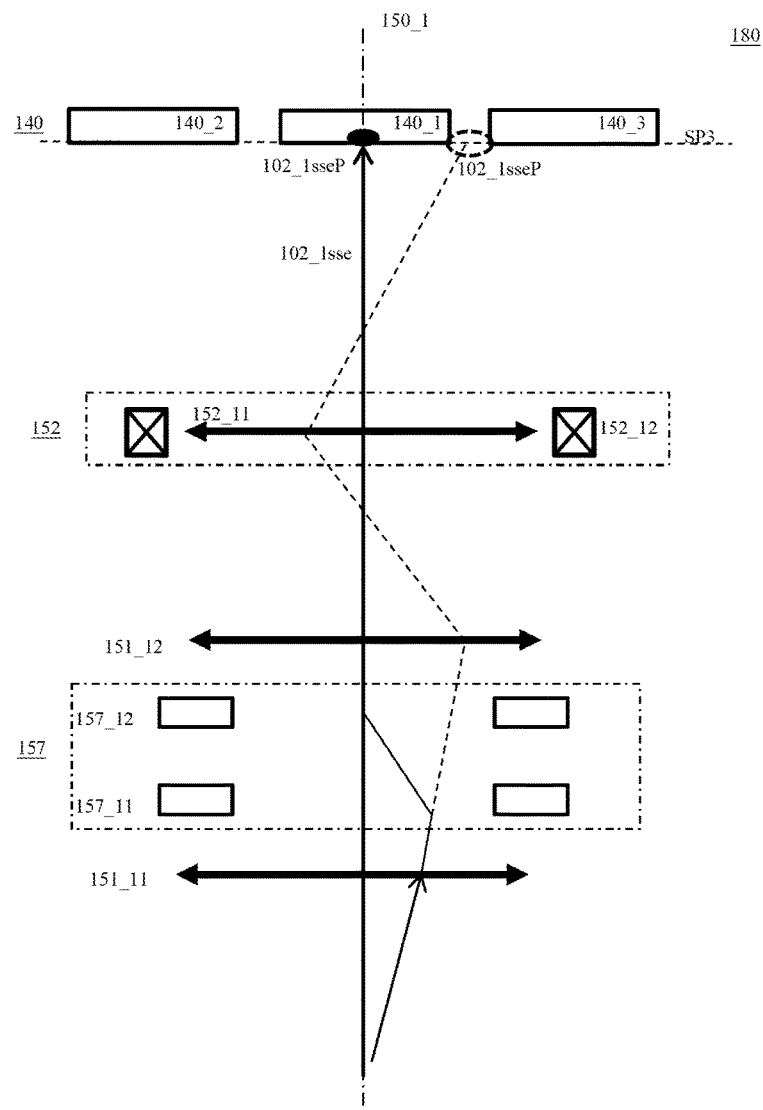
Figure 5 (Invention)

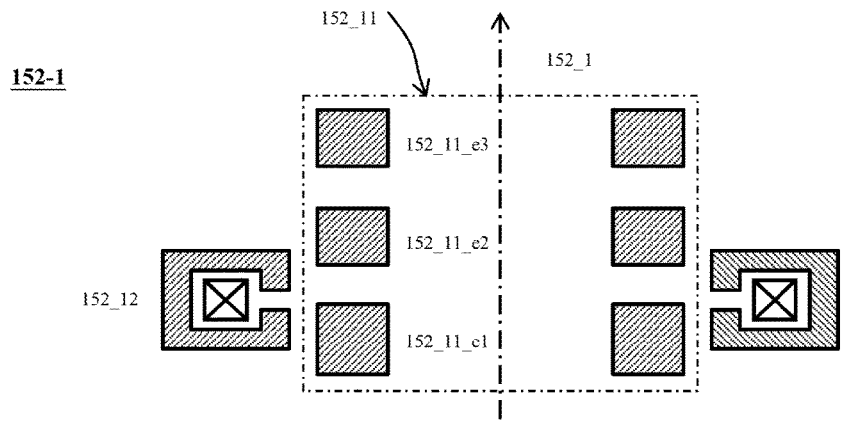
Figure 6A (Invention)
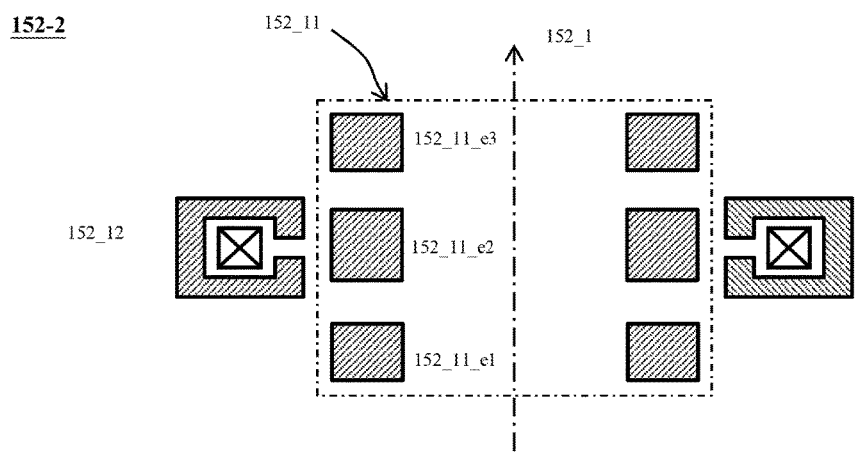
Figure 6B (Invention)
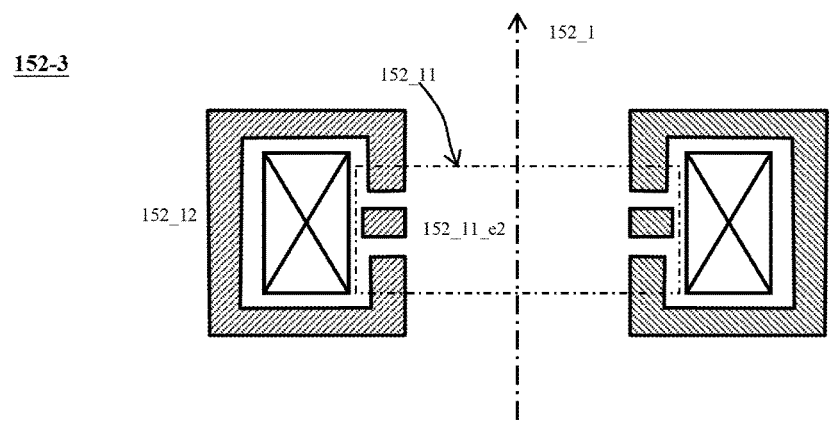
Figure 6C (Invention)

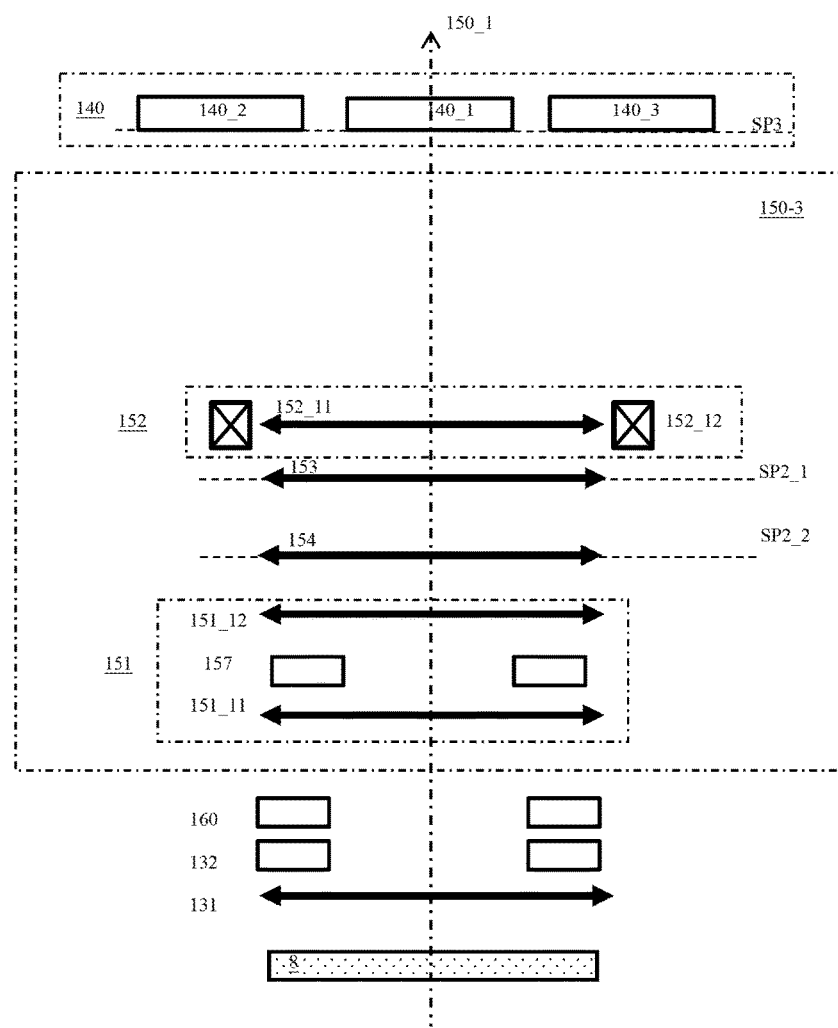
Figure 7A (Invention)

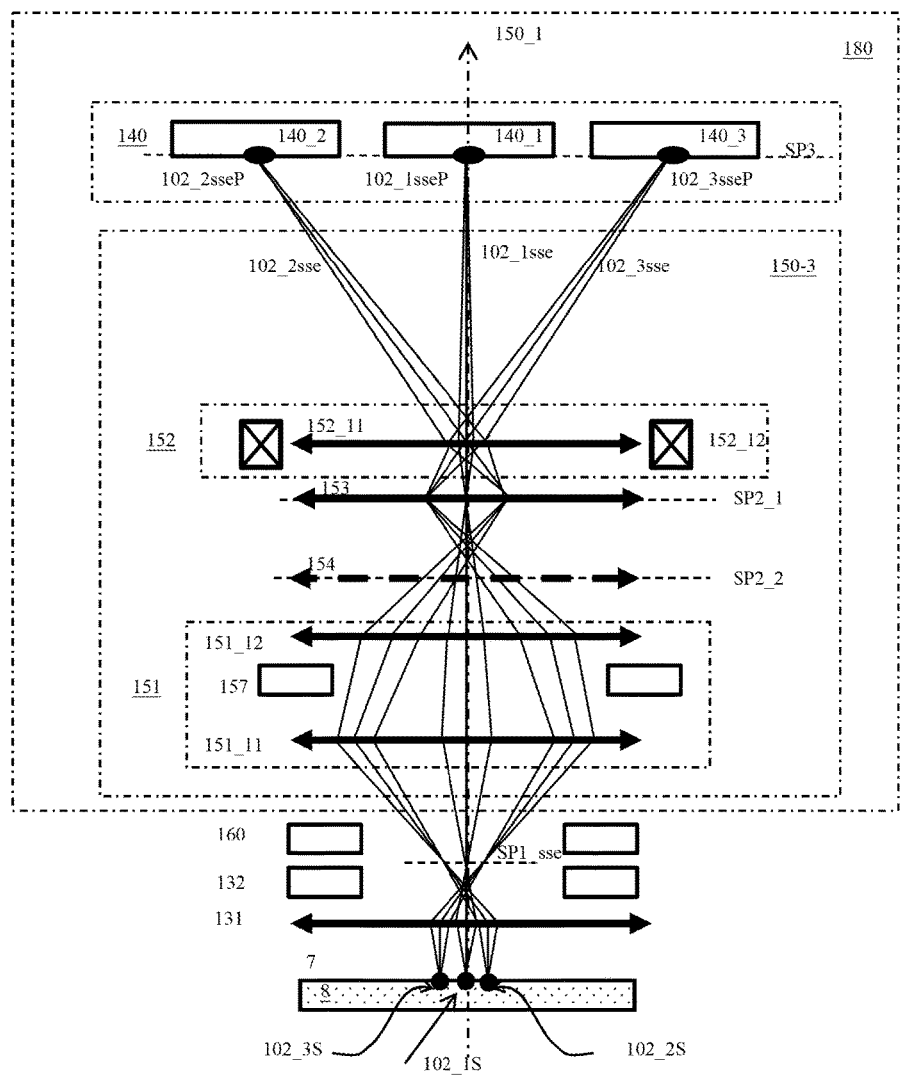
Figure 7B (Invention)

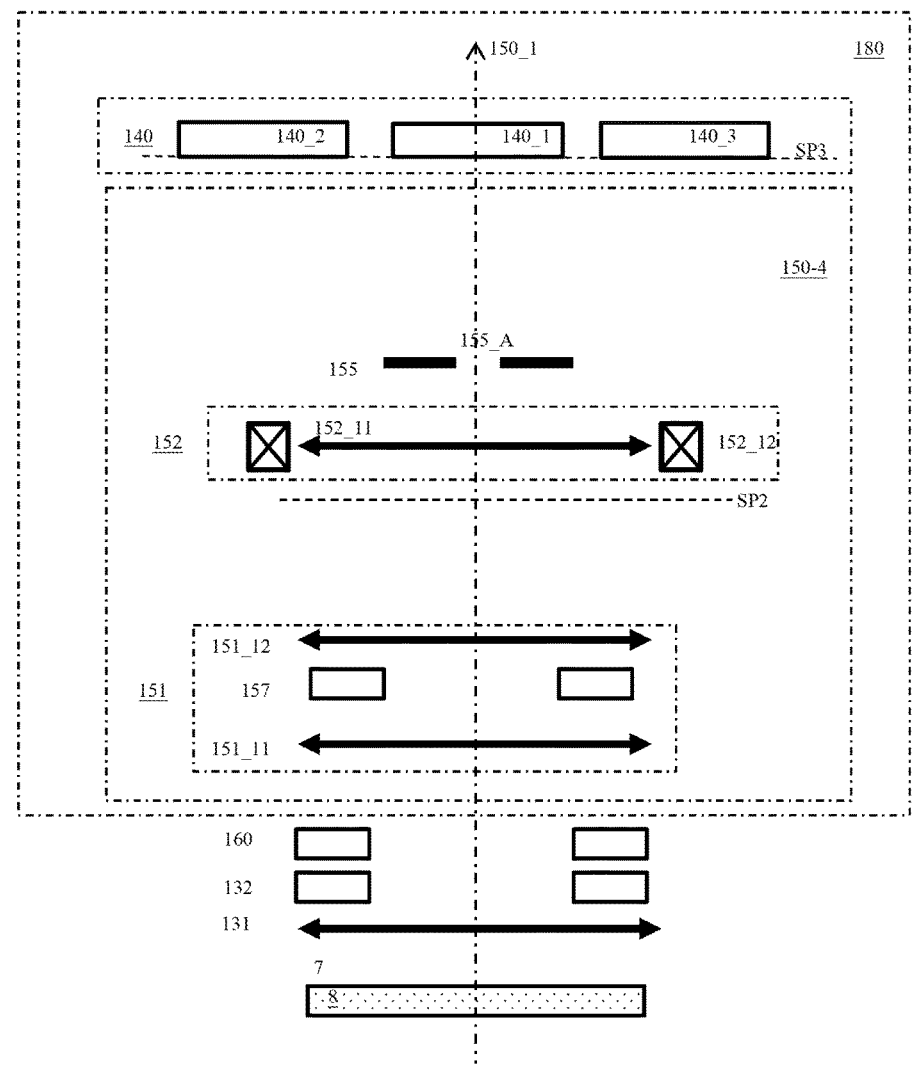
Figure 8A (Invention)

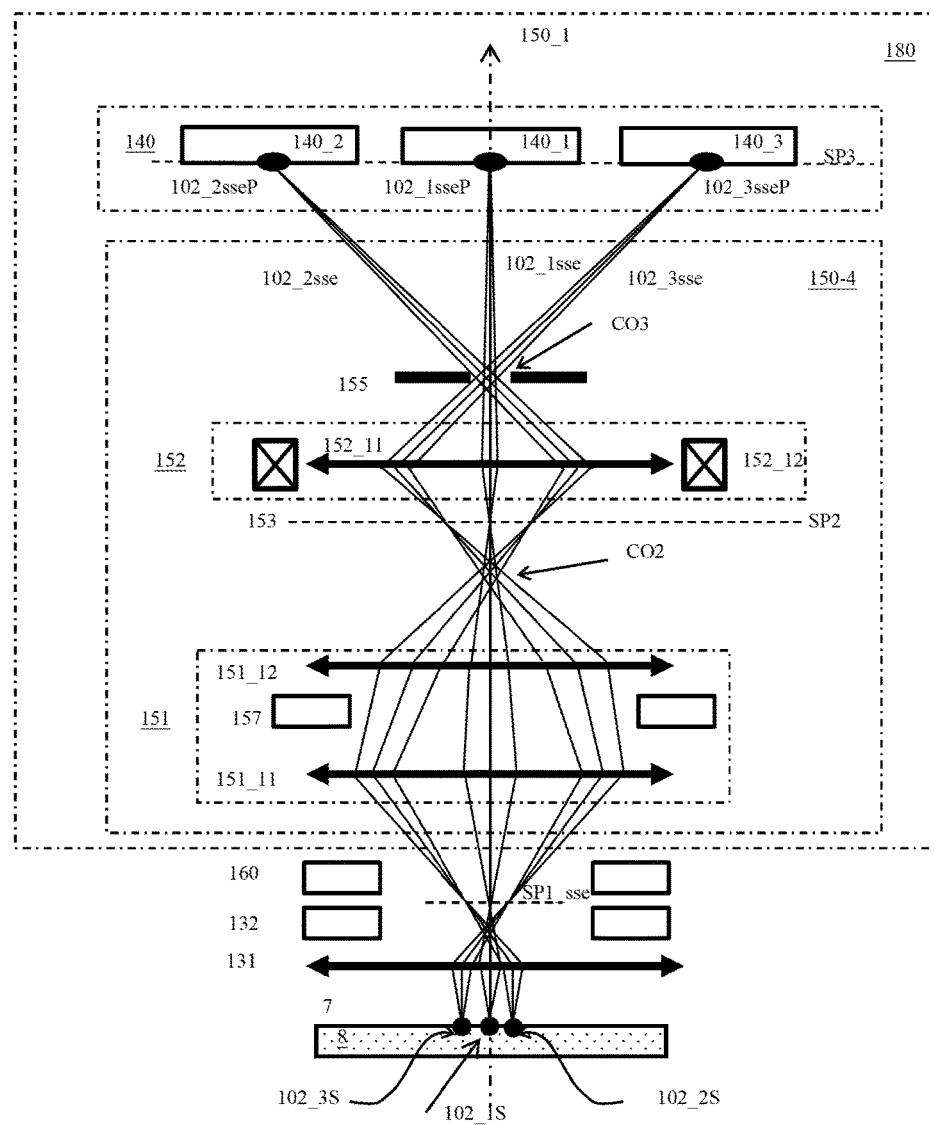
Figure 8B (Invention)

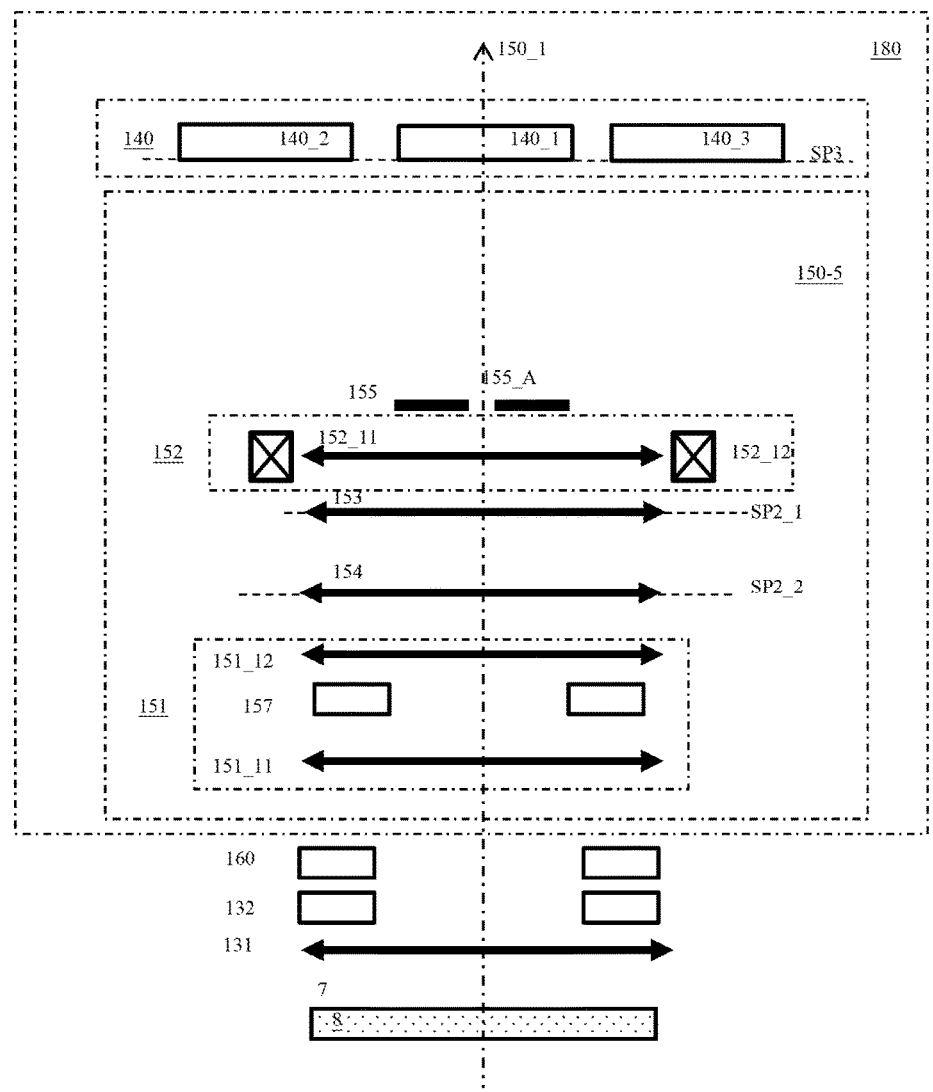
Figure 9A (Invention)

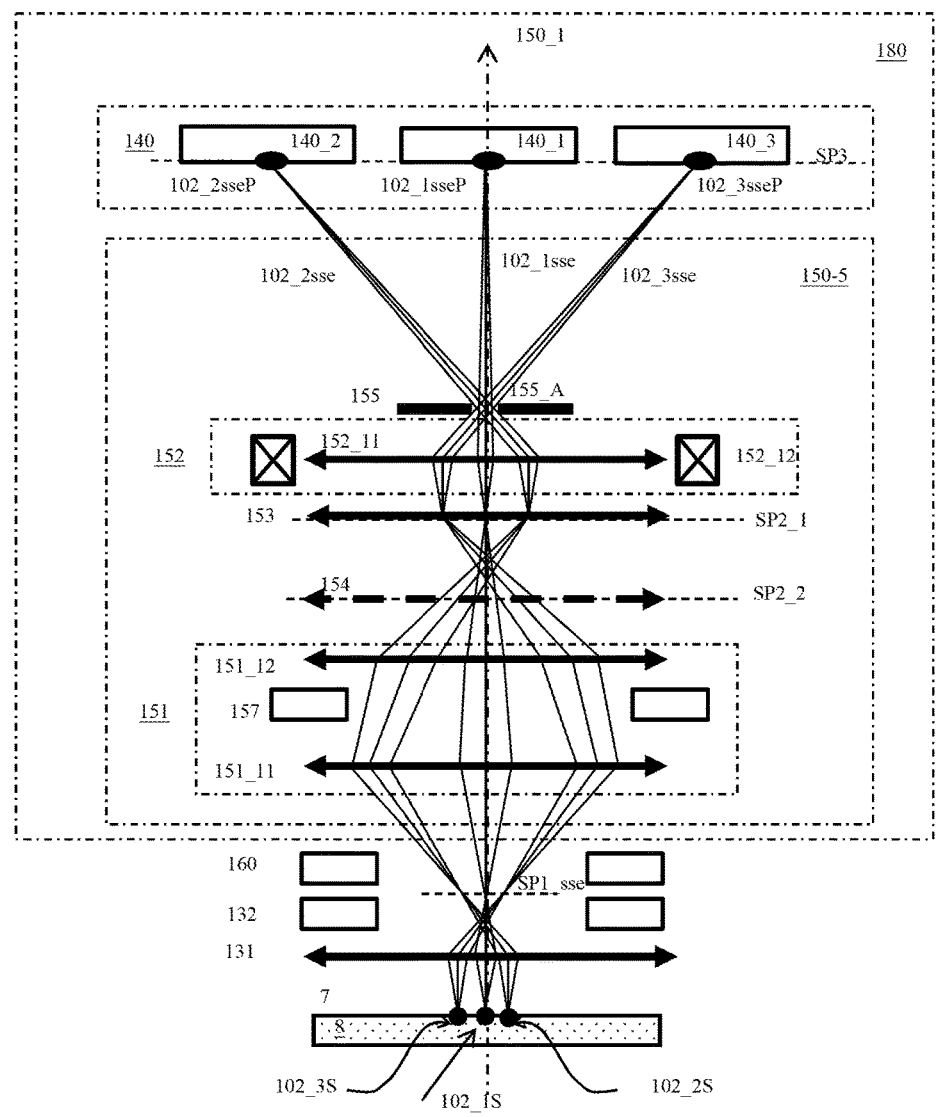
Figure 9B (Invention)

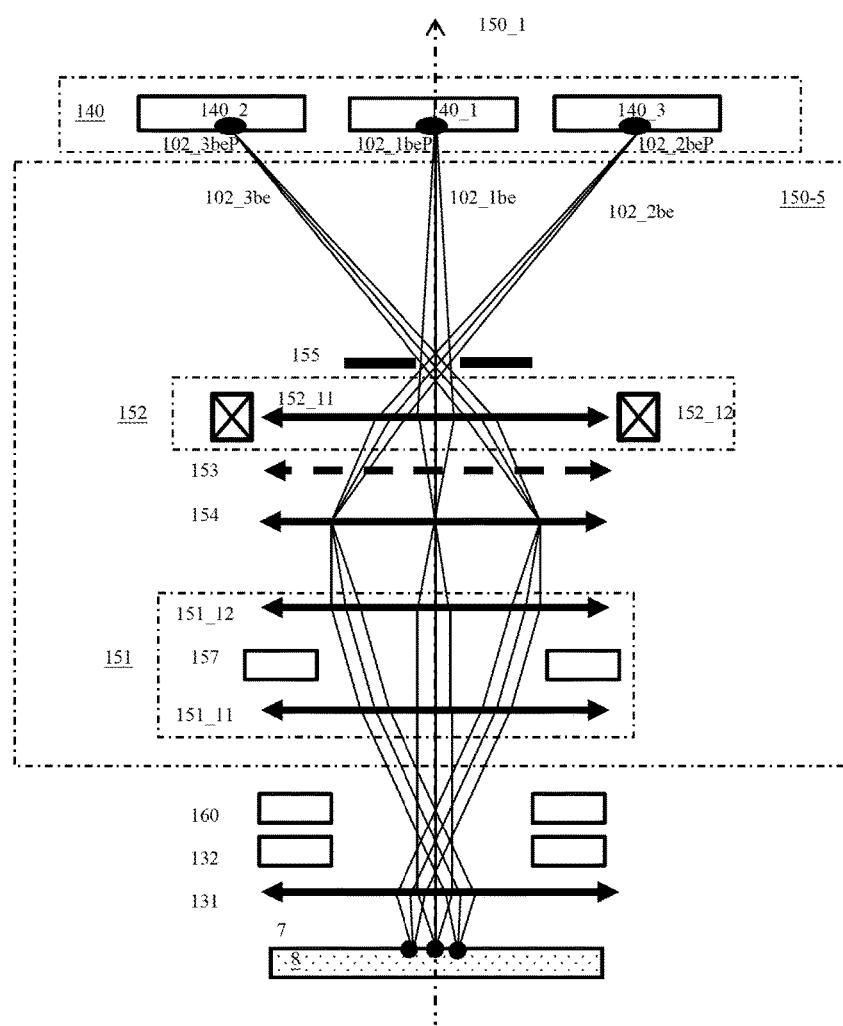
Figure 9C (Invention)

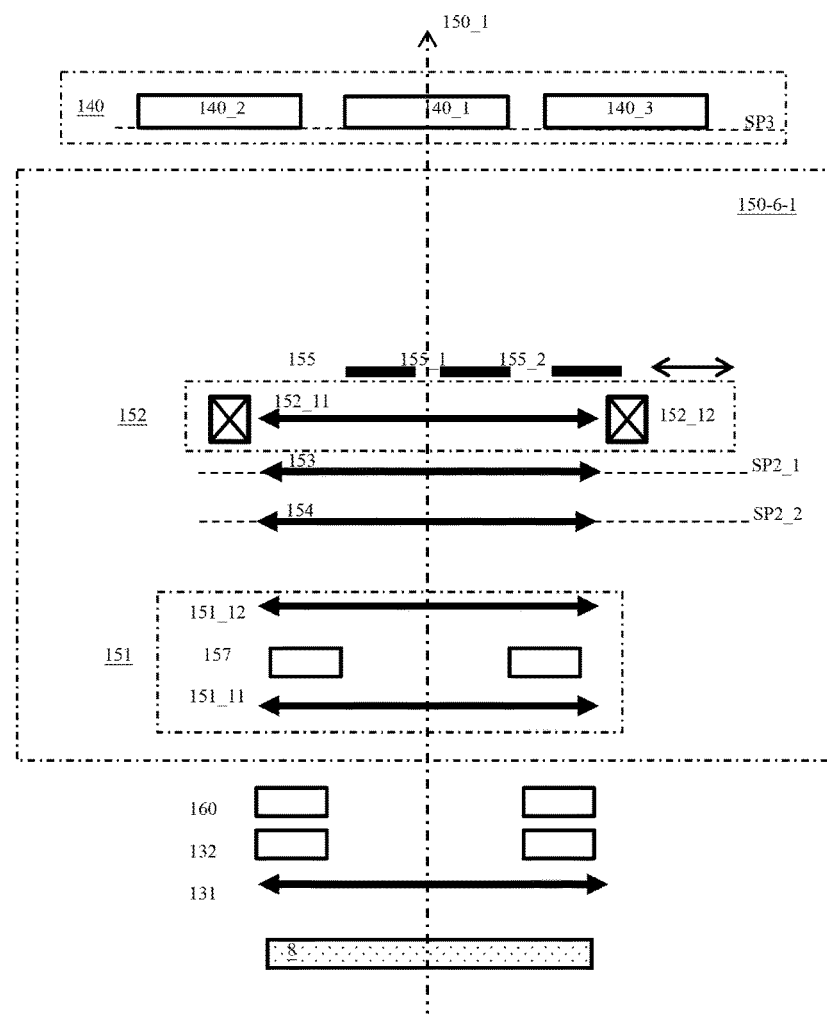
Figure 10A (Invention)

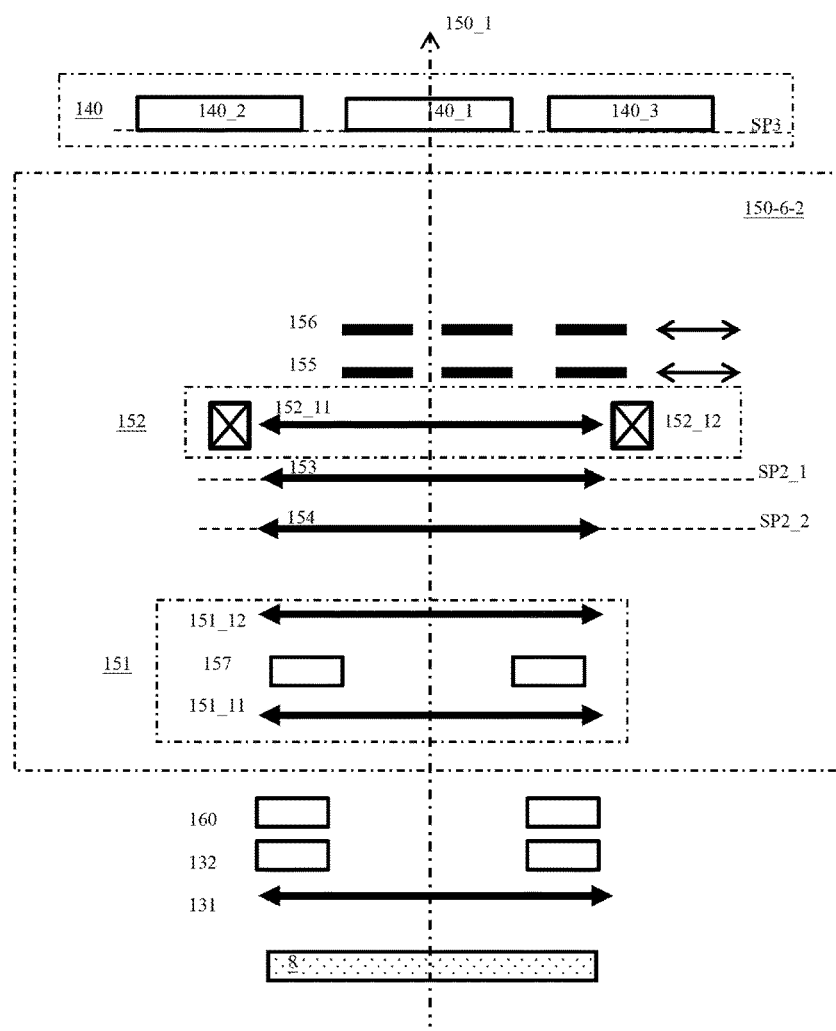
Figure 10B (Invention)

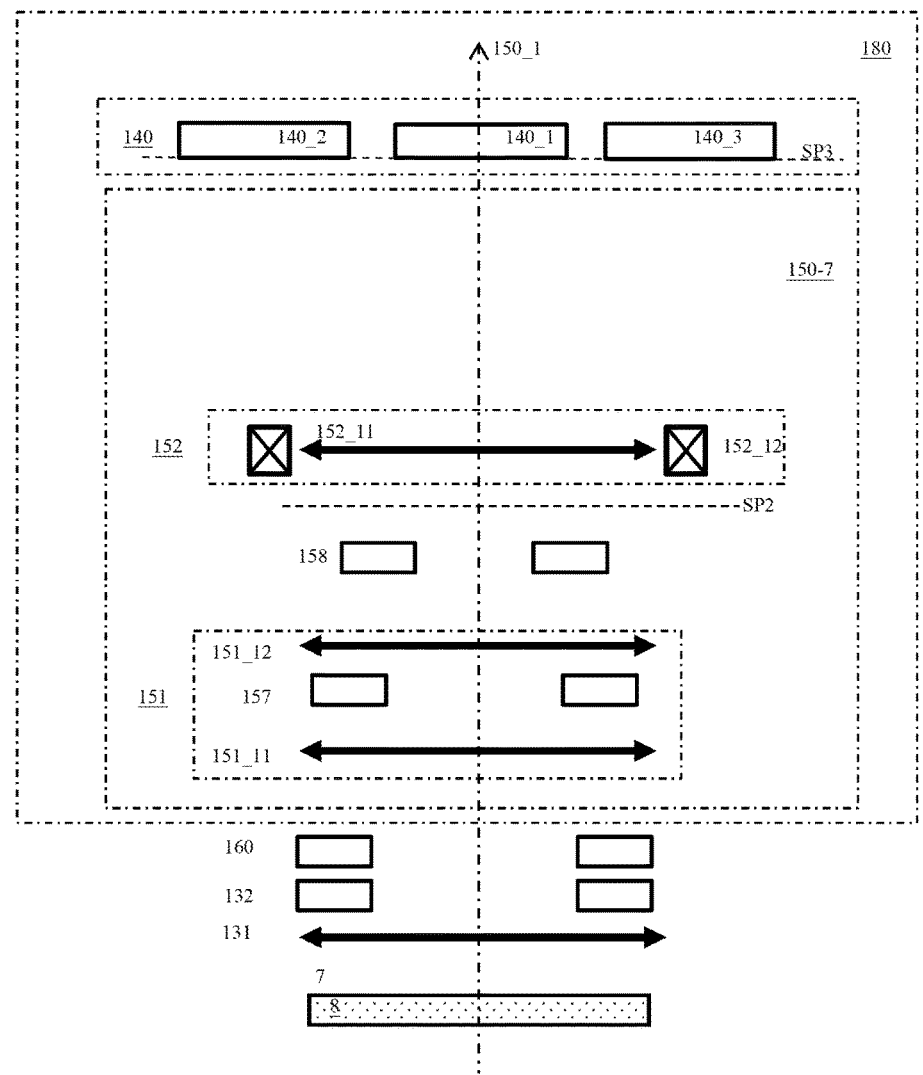
Figure 11A (Invention)

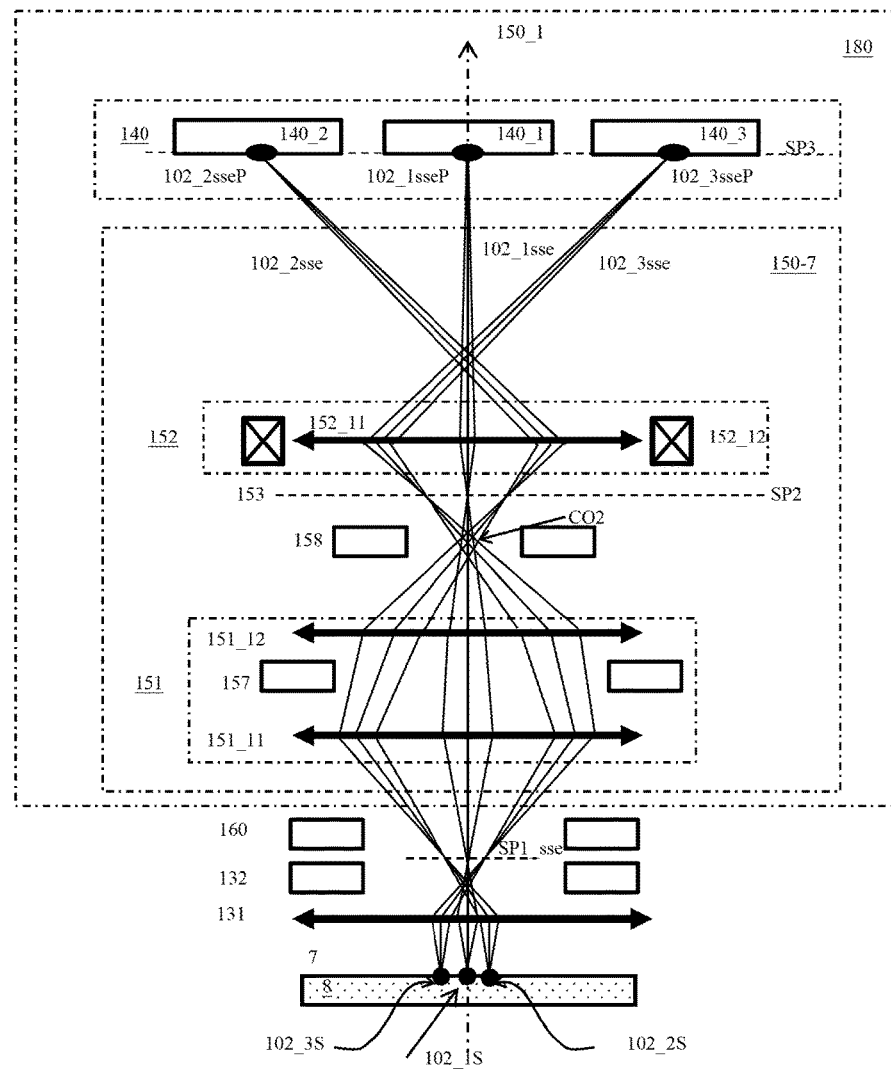
Figure 11B (Invention)

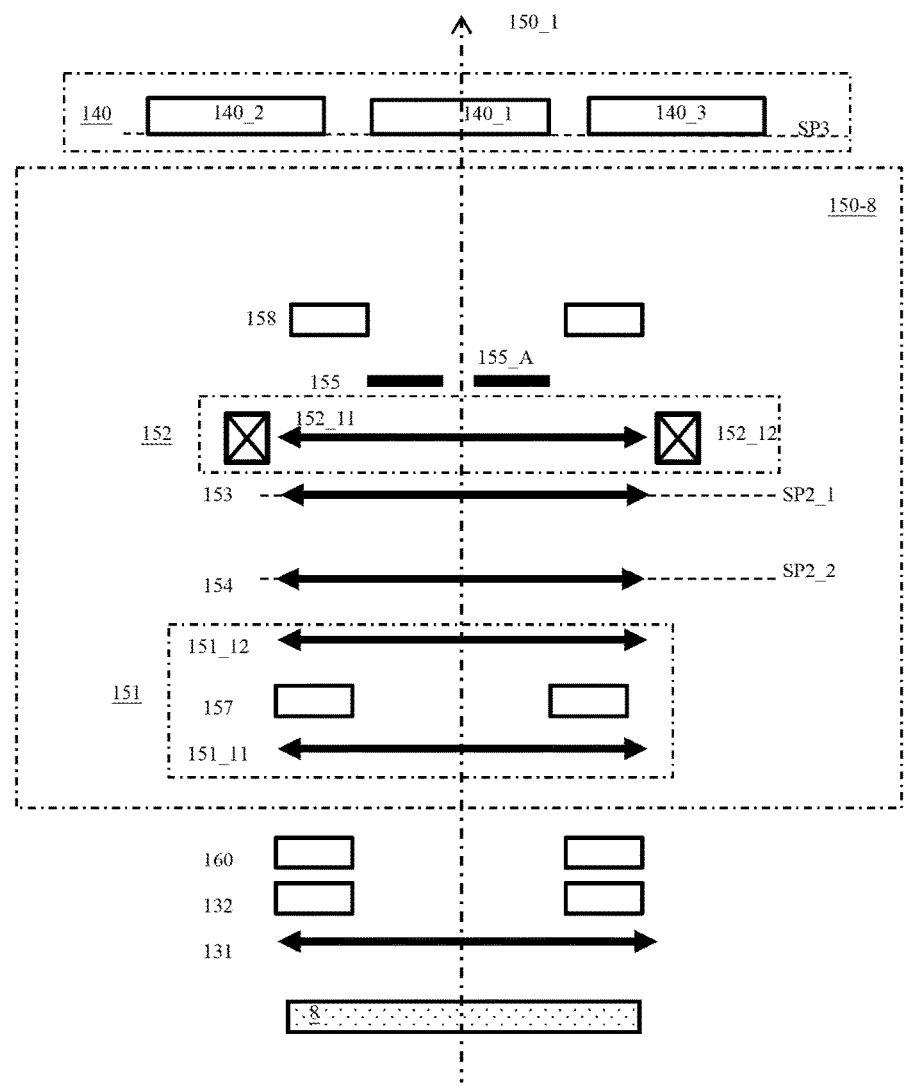
Figure 12 (Invention)

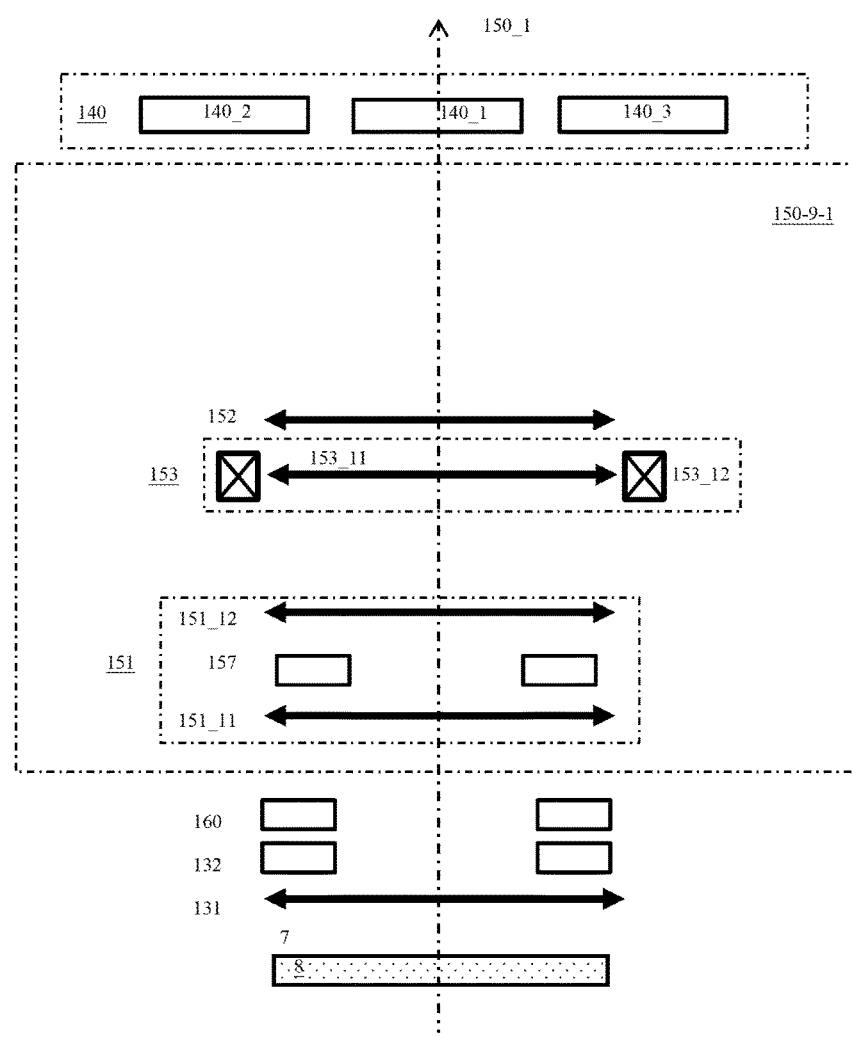
Figure 13A (Invention)

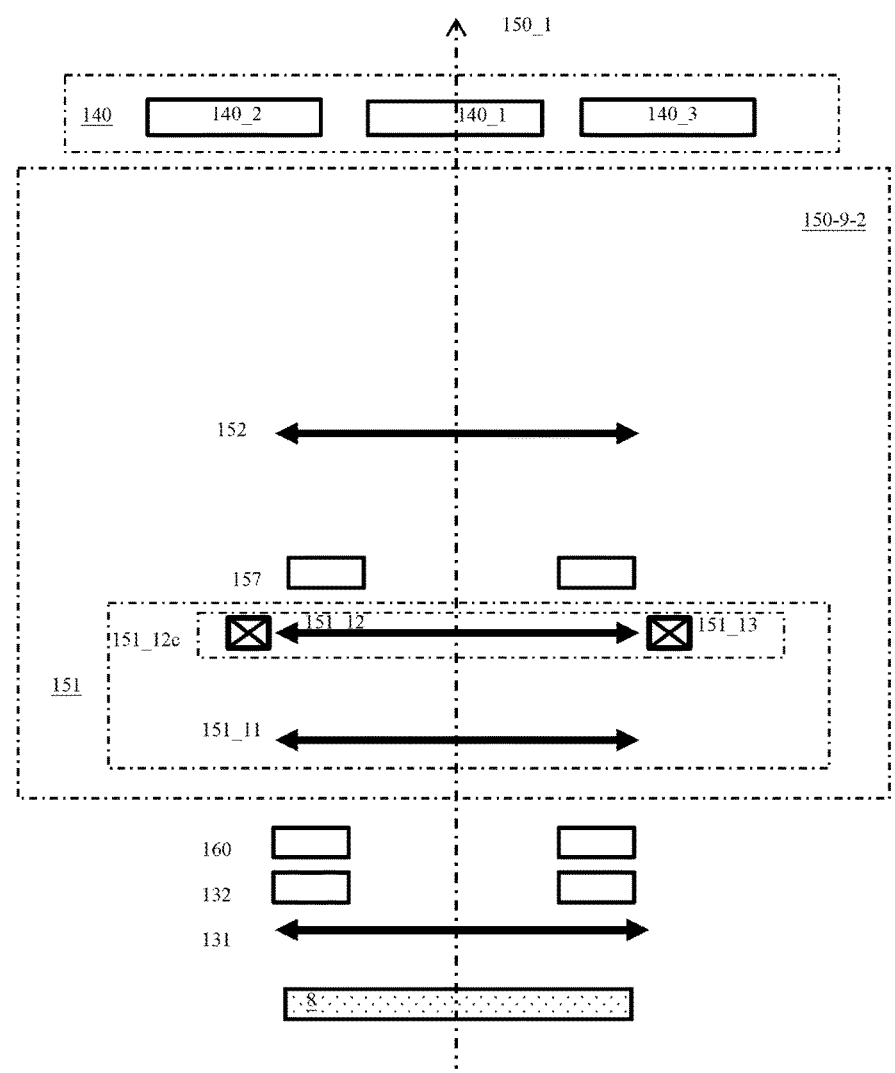
Figure 13B (Invention)

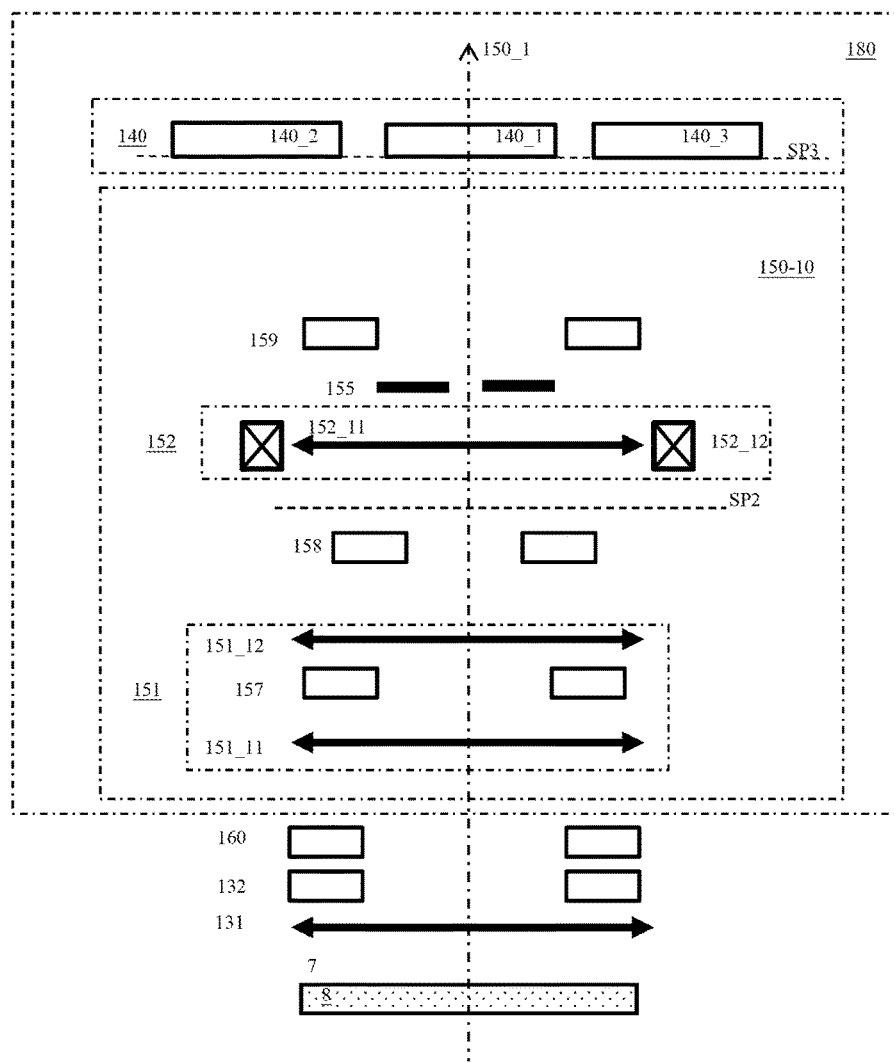
Figure 14 (Invention)

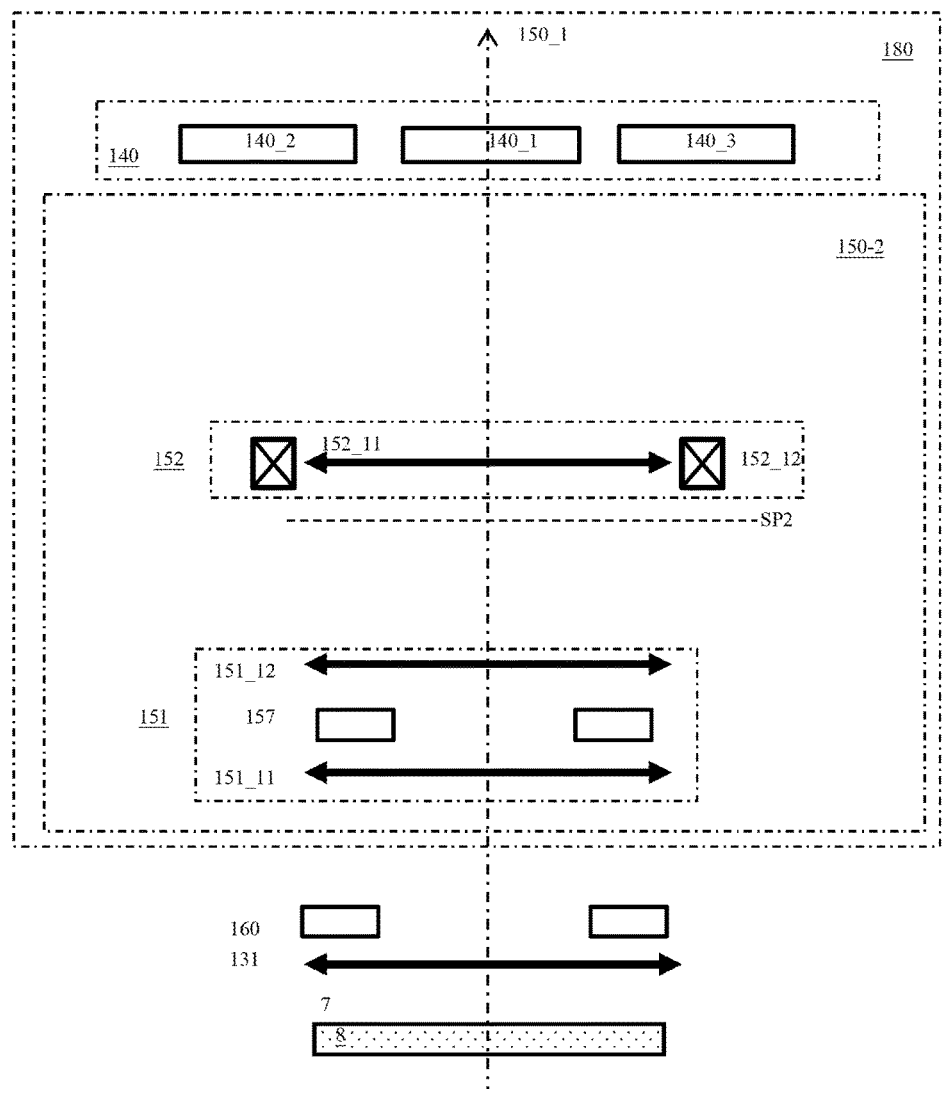
Figure 15B (Invention)

APPARATUS OF PLURAL CHARGED-PARTICLE BEAMS

CLAIM OF PRIORITY

This application claims the benefit of priority of U.S. provisional application No. 62/260,822 entitled to Ren et al. filed on Nov. 30, 2015 and entitled "Apparatus of Plural Charged-Particle Beams", the entire disclosures of which are incorporated herein by reference.

CROSS REFERENCE TO RELATED APPLICATIONS

This application is related to U.S. application Ser. No. 15/065,342 entitled to Ren et al. filed on Mar. 9, 2016 and entitled "Apparatus of Plural Charged-Particle Beams", the entire disclosures of which are incorporated herein by reference.

This application is related to U.S. application Ser. No. 15/078,369 entitled to Ren et al. filed on Mar. 23, 2016 and entitled "Apparatus of Plural Charged-Particle Beams", the entire disclosures of which are incorporated herein by reference.

This application is related to U.S. application Ser. No. 15/150,858 entitled to Liu et al. filed on May 10, 2016 and entitled "Apparatus of Plural Charged-Particle Beams", the entire disclosures of which are incorporated herein by reference.

This application is related to U.S. application Ser. No. 15/213,781 entitled to Li et al. filed on Jul. 19, 2016 and entitled "Apparatus of Plural Charged-Particle Beams", the entire disclosures of which are incorporated herein by reference.

This application is related to U.S. application Ser. No. 15/216,258 entitled to Ren et al. filed on Jul. 21, 2016 and entitled "Apparatus of Plural Charged-Particle Beams", the entire disclosures of which are incorporated herein by reference.

BACKGROUND OF THE INVENTION

1. Field of the Invention

The present invention relates to a charged-particle apparatus with a plurality of charged-particle beams. More particularly, it relates to an apparatus which employs plural charged-particle beams to simultaneously acquire images of plural scanned regions of an observed area on a sample surface. Hence, the apparatus can be used to inspect and/or review defects on wafers/masks with high resolution and high throughput in semiconductor manufacturing industry.

2. Description of the Prior Art

For manufacturing semiconductor IC chips, pattern defects and/or uninvited particles (residuals) inevitably appear on surfaces of wafers/mask during fabrication processes, which reduce the yield to a great degree. To meet the more and more advanced requirements on performance of IC chips, the patterns with smaller and smaller critical feature dimensions have been adopted. Accordingly, the conventional yield management tools with optical beam gradually become incompetent due to diffraction effect, and yield management tools with electron beam are more and more employed. Compared to a photon beam, an electron beam has a shorter wavelength and thereby possibly offering superior spatial resolution. Currently, the yield management tools with electron beam employ the principle of scanning electron microscope (SEM) with a single electron beam, which therefore can provide higher resolution but can not provide throughputs competent for mass production. Although the higher and higher beam currents can be used to increase the throughputs, the superior spatial resolutions will be fundamentally deteriorated by Coulomb Effect which increases with the beam current.

For mitigating the limitation on throughput, instead of using a single electron beam with a large current, a promising solution is to use a plurality of electron beams each with a small current. The plurality of electron beams forms a plurality of probe spots on one being-inspected or observed surface of a sample. The plurality of probe spots can respectively and simultaneously scan a plurality of small scanned regions within a large observed area on the sample surface. The electrons of each probe spot generate secondary electrons from the sample surface where they land on. The secondary electrons comprise slow secondary electrons (energies ≤50 eV) and backscattered electrons (energies close to landing energies of the electrons). The secondary electrons from the plurality of small scanned regions can be respectively and simultaneously collected by a plurality of electron detectors respectively. Consequently, the image of the large observed area can be obtained much faster than scanning the large observed area with a single beam.

The plurality of electron beams can be either from a plurality of electron sources respectively, or from a single electron source. For the former, the plurality of electron beams is usually focused onto and scans the plurality of small scanned regions by a plurality of columns respectively, and the secondary electrons from each scanned region are detected by one electron detector inside the corresponding column. The apparatus therefore is generally called as a multi-column apparatus. The plural columns can be either independent or share a multi-axis magnetic or electromagnetic-compound objective lens (such as shown in U.S. Pat. No. 8,294,095). On the sample surface, the beam interval or pitch between two adjacent beams is usually as large as 30~50 mm.

For the latter, a source-conversion unit virtually changes the single electron source into a plurality of sub-sources. The source-conversion unit comprises one beamlet-forming (or beamlet-limit) means with a plurality of beam-limit openings and one image-forming means with a plurality of electron optics elements. The plurality of beam-limit openings divides the primary-electron beam generated by the single electron source into a plurality of sub-beams or beamlets respectively, and the plurality of electron optics elements (round lenses such as U.S. Pat. No. 7,244,949 or deflectors such as CROSS REFERENCE) influence the plurality of beamlets to form a plurality of parallel (virtual if using the deflectors and real if using the round lenses) images of the single electron source. Each image can be taken as one sub-source which emits one corresponding beamlet. To make more beamlets available, the beamlet intervals are at micro meter level. Naturally, one primary projection imaging system and one deflection scanning unit within one single column are used to project the plurality of parallel images onto and scan the plurality of small scanned regions respectively. Within the single column, the plurality of secondary electron beams generated from the plurality of small scanned regions is respectively detected by a plurality of detection elements of one electron detection device. The plurality of detection elements can be a plurality of electron detectors placed side by side (such as PMT, SDD) or a plurality of pixels of one electron detector (such as e-CCD and SDD). The apparatus therefore is generally called as a multi-beam apparatus.

FIG. 1 shows one embodiment (U.S. application Ser. No. 15/216,258 in CROSS REFERENCE) of the multi-beam apparatus. The electron source 101 generates a primary-electron beam 102 along the primary optical axis 100_1 and with a source crossover 101s, whose peripheral electrons are cut off by the main aperture plate 171. The movable condenser lens 110 collimates the primary-electron beam 102 which is then perpendicularly incident onto the source-conversion unit 120. Three beamlets 102_1, 102_2 and 102_3 of the primary-electron beam 102 respectively pass through the three beam-limit openings 121_1, 121_2 and 121_3 of the beamlet-forming means 121 and are deflected to form three virtual images (located far away and difficult to show here) of the source crossover 101s by the three micro-deflectors 122_1, 122_2 and 122_3 of the image-forming means 122. The objective lens 131 focuses the three deflected beamlets 102_1, 102_2 and 102_3 onto the surface 7 of the sample 8, and accordingly generates three images 102_1S, 102_2S and 102_3S of the source crossover 101s thereon and with equal interval or pitch Ps. Each image forms one probe spot on the surface 7, and the three images are also called as three probe spots 102_1S, 102_2S and 102_3S. The deflection scanning unit 132 deflects the three beamlets 102_1~102_3 together and therefore the three probe spots 102_1S~102_3S respectively scan one scanned region of the surface 7. The principal plane 110_2 of the movable condenser lens 110 can be moved electrically within a desired range along the primary optical axis 100_1. Appropriately and simultaneously changing the focusing power and the principal plane position of the movable condenser lens 110, the current density of the collimated primary-electron beam 102 can be changed and the currents of the three probe spots 102_1S~102_3S will change accordingly.

In a multi-beam apparatus, the plurality of detection elements are placed on an image plane of the sample surface, where each secondary electron beam from one small scanned region is focused onto one corresponding detection element. Due to the emission of the secondary electrons conforms Lambert's law and has a large energy spread, all secondary electrons of each secondary electron beam can not be fully focused into the corresponding detection element. The secondary electrons detected by one detection element can be classified into two parts, the first part includes those from the corresponding secondary electron beam and the second part includes the rest from the other secondary electron beams. The two parts respectively determine the collection efficiency of secondary electrons from the corresponding small scanned region and the cross-talk level among the plurality of small scanned regions, and both influence the image resolution of the corresponding small scanned region.

The image plane can be the one formed only by the objective lens of primary projection imaging system (such as U.S. Pat. No. 6,943,349) or the one formed by the objective lens and one secondary projection imaging system such as U.S. Pat. No. 9,035,249 and U.S. application Ser. No. 15/065,342 (150 in FIG. 1). In the first case, the position of the image plane and the imaging magnification thereon change with the operation conditions of the objective lens, and the operation conditions change with the landing energies and/or currents of the plurality of beamlets. Hence the plurality of detection elements can only provide high collection efficiency and low cross-talk level for some specific applications. In the second case, the secondary projection imaging system can keep the position of the image plane and the imaging magnification thereon with respective to the operation conditions of the objective lens, therefore can provide high collection efficiency and low cross-talk level even if the landing energies and/or currents change within large ranges.

In FIG. 1, each secondary electron beam generated by each probe spot, such as 102_1se due to the probe spot 102_1S, travels along the opposite direction of the primary optical axis 100_1. After in passing focused by the objective lens 131 and deflected by the deflection scanning unit 132, the three secondary electron beams 102_1se, 102_2se and 102_3se are intentionally diverted by the beam separator 160 (such as a Wien Filter) to enter the secondary projection imaging system 150 along the secondary optical axis 150_1 thereof. The secondary projection imaging system 150 focuses the three secondary electron beams 102_1se~102_3se onto the electron detection device 140 which have three detection elements with equal pitch Pd, i.e. forming the three secondary-electron spots respectively inside the three detection elements. Therefore the electron detection device 140 can simultaneously generate the images of the three scanned regions scanned by the three probe spots 102_1S, 102_2S and 102_3S respectively.

As mentioned above, one secondary projection imaging system is critical for providing high collection efficiency and low cross-talk level even if the landing energies and/or currents of the plurality of beamlets change within large ranges. High collection efficiency is especially advantageous for achieving high inspection throughput, and low cross-talk is especially advantageous for achieving high inspection resolution. Therefore the performance of one secondary projection imaging system finally determines both of the inspection resolution and the inspection throughput. The present invention will provide one secondary projection imaging system with advanced performance for a multi-beam apparatus, especially for those used as yield management tools in semiconductor manufacturing industry.

SUMMARY OF THE INVENTION

The object of this invention is to provide a secondary projection imaging system of a multi-beam apparatus, which makes the secondary electron detection with both high collection efficiency and low cross-talk level even if the landing energies and/or currents of a plurality of beamlets change within large ranges. As a yield management tool in semiconductor manufacturing industry, the multi-beam apparatus therefore can achieve high inspection resolution and high inspection throughput in many application conditions.

Accordingly, the invention therefore provides a multi-beam apparatus for observing a surface of a sample, which comprises an electron source, a condenser lens below the electron source, a source-conversion unit below the condenser lens, an objective lens below the source-conversion unit, a deflection scanning unit below the source-conversion unit, a sample stage below the objective lens, a beam separator below the source-conversion unit, and a detection unit above the beam separator and with a secondary projection imaging system, and an electron detection device with a plurality of detection elements.

The electron source, the condenser lens, the source-conversion unit, the objective lens, the deflection scanning unit and the beam separator are aligned with a primary optical axis of the apparatus. The sample stage sustains the sample so that the surface faces to the objective lens. The detection unit is aligned with a secondary optical axis of the apparatus, and the secondary optical axis is not parallel to the primary optical axis.

The plurality of detection elements is placed on a detection plane, and the secondary projection imaging system comprises a zoom lens, an anti-scanning deflection unit and a projection lens.

The electron source generates a primary electron beam along the primary optical axis. The condenser lens focuses the primary electron beam to a certain degree. The source-conversion unit changes the primary electron beam into a plurality of beamlets and makes the plurality of beamlets form a plurality of first images of the electron source. The objective lens focuses the plurality of beamlets to image the plurality of first images onto the surface and therefore forms a plurality of probe spots thereon respectively. The deflection scanning unit deflects the plurality of beamlets to scan the plurality of probe spots respectively over a plurality of scanned regions within an observed area on the surface.

A plurality of secondary electron beams is generated by the plurality of probe spots respectively from the plurality of scanned regions and then incident to the objective lens. The objective lens in passing focuses the plurality of secondary electron beams. The beam separator deflects the plurality of secondary electron beams to enter the secondary projection imaging system along the secondary optical axis. The zoom lens focuses the plurality of secondary electron beams onto a transfer plane. The transfer plane is between the zoom lens and the projection lens. The plurality of secondary electron beams forms a first crossover between the zoom lens and the transfer plane.

The projection lens then focuses the plurality of secondary electron beams onto the detection plane. The plurality of secondary electron beams forms a second crossover between the projection lens and the detection plane and a plurality of secondary-electron spots on the detection plane. The plurality of secondary-electron spots is inside the plurality of detection elements respectively. consequently a corresponding relationship between the plurality of probe spots and the plurality of detection elements is established. Accordingly each detection element generates an image signal of one corresponding scanned region.

The anti-scanning deflection unit deflects the plurality of secondary electron beams in step with the plurality of probe spots scanning over the plurality of scanned regions to remain positions of the plurality of secondary-electron spots and thereby keeping the corresponding relationship all the time.

An imaging magnification of the zoom lens is adjusted to keep the corresponding relationship when observing the surface in different conditions.

The apparatus may further comprise a secondary beam-limit aperture to cut off peripheral electrons of the plurality of secondary electron beams. The apparatus may further comprise a field lens placed at the transfer plane to reduce off-axis aberrations of the projection lens. The apparatus may further comprise a stigmator to compensate astigmatism aberrations of the plurality of secondary electron beams due to the beam separator. The apparatus may further comprise an alignment deflector to compensate a deviation of the corresponding relationship due to manufacturing and/or assembly errors of the detection unit. The anti-scanning deflection unit is between the beam separator and the zoom lens.

In one embodiment, the zoom lens comprises a first zoom sub-lens and a second zoom sub-lens, and the second zoom sub-lens is between the first zoom sub-lens and the transfer plane. The anti-scanning deflection unit is between the first and second zoom sub-lenses. The anti-scanning deflection unit deflects the plurality of secondary electron beams incident to the second zoom sub-lens along the secondary optical axis. The secondary projection imaging system comprises a field lens placed at the transfer plane to reduce radial shifts and tilt angles of the plurality of secondary electron beams incident to the projection lens. The secondary projection imaging system comprises a secondary beam-limit aperture plate with one or more openings, and that one or one of the more openings is placed at a position of the second crossover to cut off peripheral electrons of the plurality of secondary electron beams. The secondary projection imaging system comprises a field lens placed at the transfer plane to bend the plurality of secondary electron beams to keep the position of the second crossover when observing the surface in different conditions.

In one embodiment, the secondary projection imaging system may comprise a stigmator placed at or close to the first crossover to compensate astigmatism aberrations of the plurality of secondary-electron spots due to the beam separator.

In one embodiment, the objective lens has a first magnetic lens. The field lens may have a second magnetic lens which cancels rotation variations of the plurality of secondary-electron spots when observing the surface in different conditions. The zoom lens may have a second magnetic lens which cancels rotation variations of the plurality of secondary-electron spots when observing the surface in different conditions. The projection lens may have a second magnetic lens which cancels rotation variations of the plurality of secondary-electron spots when observing the surface in different conditions.

In one embodiment, the secondary projection imaging system comprises an alignment deflector, which is between the secondary beam-limit aperture plate and the detection plane to compensate a deviation of the corresponding relationship due to manufacturing and/or assembly errors of the detection unit. The plurality of secondary electron beams is a plurality of slow secondary electron beams respectively. The plurality of secondary electron beams is a plurality of backscattered electron beams respectively.

The present invention also provides a multi-beam apparatus for observing a surface of a sample, which comprises an electron source, a condenser lens below the electron source, a source-conversion unit below the condenser lens, an objective lens below the a source-conversion unit, a deflection scanning unit below the source-conversion unit, a sample stage below the objective lens, a beam separator below the a source-conversion unit, and a detection unit above the beam separator and comprising a secondary projection imaging system and an electron detection device with a plurality of detection elements.

The electron source, the condenser lens, the source-conversion unit, the objective lens, the deflection scanning unit and the beam separator are aligned with a primary optical axis of the apparatus. The sample stage sustains the sample so that the surface faces to the objective lens. The detection unit is aligned with a secondary optical axis of the apparatus, and the secondary optical axis is not parallel to the primary optical axis.

The plurality of detection elements is placed on a detection plane. The secondary projection imaging system comprises a zoom lens, an anti-scanning deflection unit, projection lens, a first field lens at a first transfer plane and a second field lens at a second transfer plane. The first and second field lenses are between the zoom lens and the projection lens. The first field lens is between the second field lens and the projection lens.

The electron source generates a primary electron beam along the primary optical axis. The condenser lens focuses the primary electron beam to certain degree. The source-conversion unit changes the primary electron beam into a plurality of beamlets and makes the plurality of beamlets form a plurality of first image of the electron source. The objective lens focuses the plurality of beamlets to image the plurality of first images onto the surface and therefore forms a plurality of probe spots thereon respectively. The deflection scanning unit deflects the plurality of beamlets to scan the plurality of probe spots respectively over a plurality of scanned regions within an observed area on the surface.

A plurality of slow secondary electron beams and a plurality of backscattered electron beams are generated by the plurality of probe spots respectively from the plurality of scanned regions and then incident to the objective lens. The objective lens in passing focuses the plurality of slow secondary electron beams and the plurality of backscattered electron beams.

The detection unit separately operates on a SSE mode and a BSE mode when the beam separator respectively deflects the plurality of slow secondary electron beams and the plurality of backscattered electron beams to enter the secondary projection imaging system along the secondary optical axis.

In the SSE mode, the second field lens is turned off. The zoom lens focuses the plurality of slow secondary electron beams onto the first transfer plane. The first field lens bends the plurality of slow secondary electron beams towards the secondary optical axis. The projection lens focuses the plurality of slow secondary electron beams onto the detection plane. The plurality of slow secondary electron beams then forms a SSE crossover between the projection lens and the detection plane and a plurality of slow-secondary-electron spots on the detection plane. The plurality of slow-secondary-electron spots is inside the plurality of detection elements respectively. Consequently a SSE corresponding relationship between the plurality of probe spots and the plurality of detection elements is established. Accordingly each detection element generates a SSE image signal of one corresponding scanned region.

In the BSE mode, the first field lens is turned off. The zoom lens focuses the plurality of backscattered electron beams onto the second transfer plane. The second field lens bends the plurality of backscattered electron beams towards the secondary optical axis. The projection lens focuses the plurality of backscattered electron beams onto the detection plane. The plurality of backscattered electron beams then forms a BSE crossover between the projection lens and the detection plane and a plurality of backscattered-electron spots on the detection plane. The plurality of backscattered-electron spots is inside the plurality of detection elements respectively. Consequently a BSE corresponding relationship between the plurality of probe spots and the plurality of detection elements is established. Accordingly each detection element generates a BSE image signal of one corresponding scanned region.

In the SSE mode, the anti-scanning deflection unit deflects the plurality of slow secondary electron beams in step with the plurality of probe spots scanning over the plurality of scanned regions to remain positions of the plurality of slow-secondary-electron spots and thereby keeping the SSE corresponding relationship all the time.

In the BSE mode, the anti-scanning deflection unit deflects the plurality of backscattered electron beams in step with the plurality of probe spots scanning over the plurality of scanned regions to remain positions of the plurality of backscattered-electron spots and thereby keeping the BSE corresponding relationship all the time.

When observing the surface in different conditions, an imaging magnification of the zoom lens is adjusted to keep the SSE and BSE corresponding relationships in the SSE and BSE modes respectively.

In one embodiment, the secondary projection imaging system comprises a first secondary beam-limit aperture placed at the SSE crossover to cut off peripheral electrons of the plurality of slow secondary electron beams in the SSE mode. The secondary projection imaging system comprises a second secondary beam-limit aperture placed at the BSE crossover to cut off peripheral electrons of the plurality of backscattered electron beams in the BSE mode. The secondary projection imaging system comprises a first stigmator to compensate astigmatism aberrations of the plurality of slow secondary electron beams due to the beam separator in the SSE mode. The secondary projection imaging system comprises a second stigmator to compensate astigmatism aberrations of the plurality of backscattered electron beams due to the beam separator in the BSE mode. The secondary projection imaging system comprises an alignment deflector, and in the SSE mode and the BSE mode the alignment deflector compensates deviations of the SSE corresponding relationship and the BSE corresponding relationship respectively due to manufacturing and/or assembly errors of the detection unit. The anti-scanning deflection unit is between the beam separator and the zoom lens.

In one embodiment, the zoom lens comprises a first zoom sub-lens and a second zoom sub-lens, and the second zoom sub-lens is between the first zoom sub-lens and the second field lens. The anti-scanning deflection unit respectively deflects the plurality of slow secondary electron beams in the SSE mode and the plurality of backscattered electron beams in the BSE mode incident to the second zoom sub-lens along the secondary optical axis. The secondary projection imaging system comprises a first secondary beam-limit aperture plate and a second secondary beam-limit aperture plate, each having one or more openings. In the SSE mode one opening of the first secondary beam-limit aperture plate is placed at the SSE crossover to cut off peripheral electrons of the plurality of slow secondary electron beams, and in the BSE mode one opening of the second secondary beam-limit aperture plate is placed at the BSE crossover to cut off peripheral electrons of the plurality of backscattered electron beams. The SSE crossover and the BSE crossover are set at a common position by adjusting the first field lens and the second field lens respectively. The secondary projection imaging system comprises a third secondary beam-limit aperture plate with one or more openings, and that one or one of the more openings is placed at the common position in each of the SSE mode and the BSE mode. The secondary projection imaging system comprises a stigmator placed close to the third secondary beam-limit aperture plate, which compensates astigmatism aberrations of the plurality of slow-secondary-electron spots and the plurality of backscattered-electron spots in the SSE mode and the BSE mode respectively due to the beam separator.

In one embodiment, the objective lens has a first magnetic lens. The first field lens may have a second magnetic lens which cancels rotation variations of the plurality of slow-secondary-electron spots in the SSE mode when observing the surface in different conditions. The second field lens may have a third magnetic lens which cancels rotation variations of the plurality of backscattered-electron spots in the BSE mode when observing the surface in different conditions. The zoom lens may have a second magnetic lens which cancels rotation variations of the plurality of slow-secondary-electron spots in the SSE mode and the plurality of backscattered-electron spots in the BSE mode respectively when observing the surface in different conditions. The projection lens may have a second magnetic lens which cancels rotation variations of the plurality of slow-secondary-electron spots in the SSE mode and the plurality of backscattered-electron spots in the BSE mode respectively when observing the surface in different conditions.

In one embodiment, the secondary projection imaging system comprises an alignment deflector, which compensates deviations of the SSE corresponding relationship and the BSE corresponding relationship respectively due to manufacturing and/or assembly errors of the detection unit.

The present invention also provides a method to configure a detection system of a multi-beam apparatus for observing a surface of a sample, which comprises steps of using a beam separator to deflect a plurality of secondary electron beams generated by a plurality of probe spots on the surface to travel along a secondary optical axis of the apparatus; step of using a zoom lens to focus the plurality of secondary electron beams onto a transfer plane, wherein the zoom lens is aligned with the secondary optical axis; step of using a projection lens to focus the plurality of secondary electron beams from the transfer plane onto a detection plane and form a plurality of secondary-electron spots thereon, wherein the projection lens is aligned with the secondary optical axis; using an electron detection device with a plurality of detection elements to detect the plurality of secondary-electron spots respectively, wherein the plurality of detection elements is placed on the detection plane; step of using an anti-scanning deflection unit to deflect the plurality of secondary electron beams in step with the plurality of probe spots scanning over a plurality of scanned regions on the surface to keep positions of the plurality of secondary-electron spots all the time; and step of adjusting the zoom lens and the projection lens to cancel radial and rotational variations of positions of the plurality of secondary-electron spots when observing the surface in different conditions.

The method may further comprise a step of using a secondary beam-limit aperture to cut off peripheral electrons of the plurality of secondary electron beams. The method may further comprise a step of using a field lens to reduce off-axis aberrations of the plurality of secondary-electron spots. The method may further comprise a step of using a stigmator to compensate astigmatism aberrations of the plurality of secondary-electron spots due to the beam separator. The method may further comprise a step of using an alignment deflector to compensate a shift between the plurality of secondary-electron spots and the plurality of detection elements due to manufacturing and/or assembly errors of the detection unit.

The present invention also provides a method to configure a detection system of a multi-beam apparatus for observing a surface of a sample, which comprises steps of operating in a SSE mode, and operating in a BSE mode. The step of operating in a SSE mode comprise steps of using a beam separator to deflect a plurality of slow secondary electron beams generated by a plurality of probe spots on the surface to travel along a secondary optical axis of the apparatus; step of using a zoom lens aligned with the secondary optical axis to focus the plurality of slow secondary electron beams onto a first transfer plane; step of using a first field lens aligned with the secondary optical axis and placed at the first transfer plane to bend the plurality of slow secondary electron beams; step of using a projection lens aligned with the secondary optical axis to focus the plurality of secondary electron beams onto a detection plane and form a SSE crossover therebetween and a plurality of slow-secondary-electron spots thereon; step of using an electron detection device with a plurality of detection elements to detect the plurality of slow-secondary-electron spots respectively, wherein the plurality of detection elements is placed on the detection plane; step of using an anti-scanning deflection unit to deflect the plurality of slow secondary electron beams in step with the plurality of probe spots scanning over a plurality of scanned regions on the surface to keep positions of the plurality of slow-secondary-electron spots all the time; and step of adjusting the zoom lens and the projection lens to cancel radial and rotational variations of positions of the plurality of slow-secondary-electron spots respectively when observing the surface in different conditions. The step of operating in a BSE mode comprise steps of using the beam separator to deflect a plurality of backscattered electron beams generated by the plurality of probe spots on the surface to travel along the secondary optical axis of the apparatus; step of using the zoom lens to focus the plurality of backscattered electron beams onto a second transfer plane; step of using a second field lens aligned with the secondary optical axis and placed at the second transfer plane to bend the plurality of backscattered electron beams; step of using the projection lens to focus the plurality of backscattered electron beams onto the detection plane and form a BSE crossover therebetween and a plurality of backscattered-electron spots thereon; step of using the plurality of detection elements to detect the plurality of backscattered-electron spots respectively; step of using the anti-scanning deflection unit to deflect the plurality of backscattered electron beams in step with the plurality of probe spots scanning over the plurality of scanned regions to keep positions of the plurality of backscattered-electron spots all the time; and step of adjusting the zoom lens and the projection lens to cancel radial and rotational variations of positions of the plurality of backscattered-electron spots respectively when observing the surface in different conditions.

In one embodiment, the step of operating in the SSE mode comprises a sub-step of using a first secondary beam-limit aperture at the SSE crossover to cut off peripheral electrons of the plurality of slow secondary electron beams. The step of operating in the BSE mode comprises a sub-step of using a second secondary beam-limit aperture at the BSE crossover to cut off peripheral electrons of the plurality of backscattered electron beams. The SSE crossover and the BSE crossover are at or close to a same place. The step of operating in the SSE mode comprises a sub-step of using a stigmator placed close to the same place to compensate astigmatism aberrations of the plurality of slow-secondary-electron spots due to the beam separator. The step of operating in the BSE mode comprises a sub-step of using the stigmator to compensate astigmatism aberrations of the plurality of backscattered-electron spots due to the beam separator. The step of operating in the SSE mode comprises a sub-step of using an alignment deflector to compensate a shift between the plurality of slow-secondary-electron spots and the plurality of detection elements due to manufacturing and/or assembly errors of the detection unit. The step of operating in the BSE mode comprises a sub-step of using the alignment deflector to compensate a shift between the plurality of backscattered-electron spots and the plurality of detection elements due to manufacturing and/or assembly errors of the detection unit.

The present invention also provides an imaging system for a detection device in a multi-beam apparatus, which comprises means for focusing a plurality of charged particle beams emanated from a sample surface to a plurality of detection elements of the detection device respectively, and means for canceling rotation of the plurality of charged particle beams induced by a magnetic objective lens in the multi-beam apparatus.

In one embodiment, the imaging system may further comprises means for canceling scanning of the plurality of charged particle beams on the detection device, which is induced by a deflection scanning unit in the multi-beam apparatus. The plurality of charged particle beams includes a plurality of slow secondary electron beams and a plurality of backscattered electron beams. The detection device is a semiconductor diode detector. The canceling-scanning means is located close to an entrance side of the imaging system. The canceling-scanning means includes a first deflector and a second deflector in sequence along an optical axis of the imaging system. The focusing means includes a zoom lens and a projecting lens in sequence along the optical axis.

In one embodiment, the magnetic objective lens and the zoom lens focus the plurality of charged particle beams into a transfer plane, and the projecting lens focuses the plurality of charged particle beams from the transfer plane into a detection plane on the detection device. The zoom lens includes a first electrostatic lens and a second electrostatic lens in sequence along the optical axis. The canceling-scanning means locates between the first electrostatic lens and a second electrostatic lens. The zoom lens may include a magnetic lens being the canceling-rotation means. The projecting lens may include an electrostatic lens and a magnetic lens being the canceling-rotation means.

In one embodiment, the imaging system may further comprise a field lens at the transfer plane for reducing aberration of the plurality of charged particle beams. The field lens includes an electrostatic lens. The field lens may include a magnetic lens being the canceling-rotation means.

In one embodiment, the imaging system may further comprise a plate with at least one opening, one opening of the plate being as a beam-limit aperture for reducing sizes of the plurality of charged particle beams on the detection device. The plate includes a plurality of selectable openings with different sizes. The plate locates at a crossover of the plurality of charged particle beams between the projecting lens and the detection device.

In one embodiment, the imaging system may further comprise a stigmator for reducing astigmatism of the plurality of charged particle beams. The stigmator locates at a crossover of the plurality of charged particle beams.

In one embodiment, the imaging system may further comprise an alignment deflector for aligning the plurality of charged particle beams with a plurality of detection elements of the detection device respectively. The alignment deflector locates between the detection device and the projecting lens.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which:

FIG. 2 is a schematic illustration of a secondary projection imaging system in accordance with one embodiment of the present invention.

FIG. 3A is a schematic illustration of a secondary projection imaging system in accordance with another embodiment of the present invention.

FIG. 3B is a schematic illustration of the slow secondary electrons traveling in the secondary projection imaging system in FIG. 3A in accordance with the present invention.

FIG. 5 is a schematic illustration of an anti-scanning deflection unit operating in FIG. 3A in accordance with the present invention.

FIGS. 6A~6C are schematic illustrations of three configurations of the electromagnetic compound projection lens in FIG. 3A in accordance with the present invention.

FIG. 7A is a schematic illustration of a secondary projection imaging system in accordance with another embodiment of the present invention.

FIG. 7B is a schematic illustration of the slow secondary electrons traveling in the secondary projection imaging system in FIG. 7A in accordance with the present invention.

FIG. 8A is a schematic illustration of a secondary projection imaging system in accordance with another embodiment of the present invention.

FIG. 8B is a schematic illustration of the slow secondary electrons traveling in the secondary projection imaging system in FIG. 8A in accordance with the present invention.

FIG. 9A is a schematic illustration of a secondary projection imaging system in accordance with another embodiment of the present invention.

FIG. 9B is a schematic illustration of the slow secondary electrons traveling in the secondary projection imaging system in FIG. 9A in accordance with the present invention.

FIG. 9C is a schematic illustration of the backscattered electrons traveling in the secondary projection imaging system in FIG. 9A in accordance with the present invention.

FIG. 10A is a schematic illustration of a secondary projection imaging system in accordance with another embodiment of the present invention.

FIG. 10B is a schematic illustration of a secondary projection imaging system in accordance with another embodiment of the present invention.

FIG. 11A is a schematic illustration of a secondary projection imaging system in accordance with another embodiment of the present invention.

FIG. 11B is a schematic illustration of the slow secondary electrons traveling in the secondary projection imaging system in FIG. 11A in accordance with the present invention.

FIG. 12 is a schematic illustration of a secondary projection imaging system in accordance with another embodiment of the present invention.

FIG. 13A and FIG. 13B are schematic illustrations of two options to realize the anti-rotating function in a secondary projection imaging system in accordance with the present invention.

FIG. 14 is a schematic illustration of a secondary projection imaging system in accordance with another embodiment of the present invention.

FIG. 15B is a schematic illustration of one detection system in accordance with the embodiment in FIG. 15A.

DETAILED DESCRIPTION OF EXAMPLE EMBODIMENTS

Figure 1:
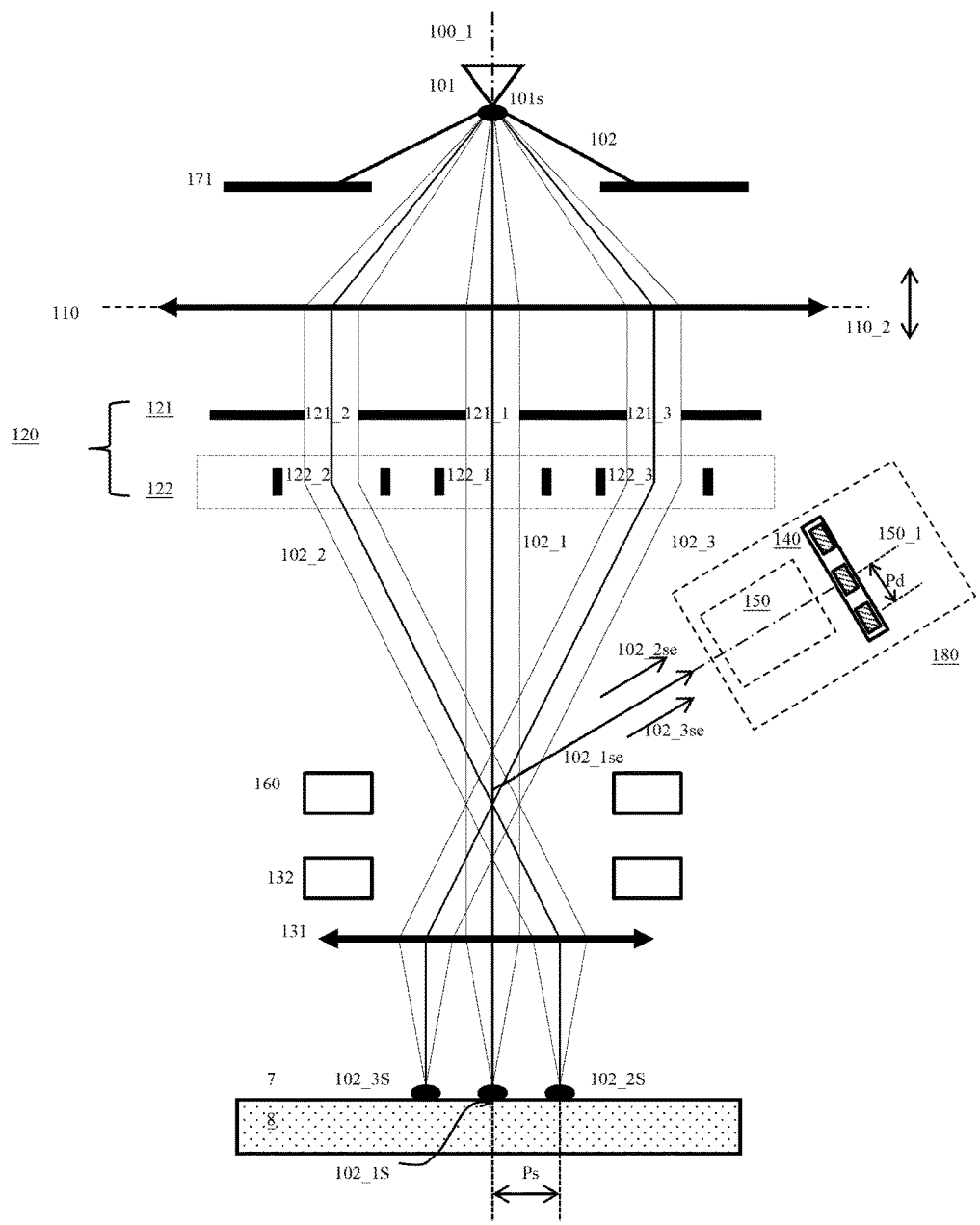
FIG. 1 is a schematic illustration of a conventional configuration of a multi-beam apparatus.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of an electron optics element (such as a round lens or a multipole lens), an imaging system or an apparatus", "radial" means "in a direction perpendicular to the optical axis", "on-axial" means "on or aligned with the optical axis, and "off-axis" means "not on or not aligned with the optical axis".

In this invention, that "an imaging system is aligned with an optical axis" means that "all the electron optics elements are aligned with the optical axis".

In this invention, X, Y and Z axe form Cartesian coordinate. The primary optical axis of the primary projection imaging system is on the Z-axis, and the primary electron beam travels along the Z-axis.

In this invention, "primary electrons" means "electrons emitted from an electron source and incident onto a being-observed or inspected surface of a sample, and "secondary electrons" means "electrons generated from the surface by the "primary electrons".

In this invention, "secondary-electron beam crossover" means "one crossover of the secondary electron beams, "secondary beam-limit aperture" means "an opening which limits one secondary electron beam", and "primary beam-limit opening" means "an opening which limits a primary beamlet".

This invention proposes one secondary projection imaging system for a multi-beam apparatus. To clearly describe how the secondary projection imaging system functions in one multi-beam apparatus, the embodiment 100A in FIG. 1 is taken as an example. For sake of clarity, only three beamlets are shown and the number of beamlets can be anyone.

In FIG. 1, three secondary electron beams 102_1se, 102_2se and 102_3se respectively generated by the three probe spots 102_1S, 102_2S and 102_3S, travel opposite to the primary optical axis 100_1, pass through the objective lens 131 and the deflection scanning unit 132 in succession. Then the beam separator 160 (Wien Filter) deflects the three secondary electron beams to enter the secondary projection imaging system 150 along the secondary optical axis 150_1 thereof. The secondary projection imaging system 150 focuses the three secondary electron beams 102_1se~102_3se onto the three detection elements of the electron detection device 140. Therefore the three detection elements respectively and simultaneously generate the image signals of the three scanned regions scanned by the three probe spots 102_1S~102_3S. The electron detection device 140 and the secondary projection imaging system 150 form one detection unit 180. The electron optics elements on the paths of the secondary electron beams, i.e. the objective lens 131, the deflection scanning unit 132, the beam separator 160, the secondary projection imaging system 150 and the electron detection device 140, form one detection system.

As well known, the emission of secondary electrons basically obeys Lambert's law and has a large energy spread. The energy of one slow secondary electron is up to 50 eV and mostly close to 1~5 eV depending on the sample material, while the energy of one backscattered electron is up to and mostly close to the landing energy of the primary electron. Hence the slow secondary electrons and the backscattered electrons are very different in energy. Dependent on the features and materials of the sample, the landing energies usually used are with the range 0.1 keV~5 keV, which is almost equal to the energy difference between the slow secondary electron beam and the backscattered electron beam. However, such a large energy difference incurs two problems. At first, due to the focusing influence of the objective lens 131 on an electron increases with decrease of the energy thereof, the focusing power for the slow secondary electron beam is stronger than that for the backscattered electron beam. Consequently, for each probe spot (such as 102_1S), the objective lens focuses the slow secondary electron beam and the backscattered electron beam onto two different image planes with two different imaging magnifications. Secondly, due to the deflection influence of the beam separator 160 on an electron increases with decrease of the energy thereof, the deflection power for the slow secondary electron beam is stronger than that for the backscattered electron beam. As a result, for each probe spot (such as 102_1S), the beam separator 160 is not able to simultaneously deflect both the slow secondary electron beam and the backscattered electron beam to enter the secondary projection imaging system 150 along the secondary optical axis 150_1. Thus, different from a conventional SEM, for each scanned region scanned by one probe spot, the detection system can not detect one image formed by the slow secondary electrons and the backscattered electrons together. Accordingly, the detection system will operate either on one mode which detects the image with slow secondary electrons or on one mode which detects the image with backscattered electrons, respectively called as SSE mode and BSE mode. In the SSE mode and the BSE mode, the beam separator 160 respectively deflects slow secondary electron beams and the backscattered electron beams to enter the secondary projection imaging system 150 along the secondary optical axis 150_1, and the secondary projection imaging system 150 respectively focuses the slow secondary electron beams and the backscattered electron beams into the detection elements of the electron detection device 140.

As mentioned above, the landing energies of the beamlets 102_1~102_3 may be changed with the range 0.1 keV~5 keV for different inspection applications. The landing energies can be changed by varying either or both of the potential of the single electron source 101 or the potential of the sample 8. Therefore the excitation of the objective lens 131 needs to be adjusted to provide the corresponding focusing power for the three beamlets, and the focusing powers of the objective lens 131 for the slow secondary electron beams and the backscattered electron beams accordingly vary. Thus, the positions and the magnifications of the images, respectively formed by the slow secondary electron beam and the backscattered electron beam, will change with the landing energies. Furthermore, the objective lens 131 is usually a magnetic lens or an electromagnetic compound lens due to the low aberrations thereof. In this case, the rotations of the images respectively formed by the slow secondary electron beam and the backscattered electron beam will also change with the landing energies. The foregoing image variations may move the positions of the secondary-electron spots formed by the secondary electron beams on the electron detection device 140 to such an extent that the secondary electron beams can not be detected by the corresponding detection elements. Thus, the secondary projection imaging system 150 needs to comprise a zoom function to eliminate the imaging magnification variation and an anti-rotating function to eliminate the image rotation variation.

Due to the positions of the secondary-electron spots will move with the three probe spots 102_1S~102_3S scanning over the three scanned regions, each of the secondary-electron spots may partially enter one adjacent detection element when the corresponding probe spot moves to one place adjacent to the neighbor scanned region (i.e. the sizes of each scanned region are close to the pitch Ps or if the deflection influence of the deflection scanning unit 132 on the secondary electrons is too strong. The secondary electrons detected by the adjacent detection elements will generate image overlaps of three scanned regions. Such an image overlap will deteriorate the image resolution and therefore needs to be eliminated. Thus, the secondary projection imaging system needs to have one anti-scanning function to keep the three secondary-electron spots within the corresponding detection elements all the time.

Next, some embodiments of the secondary projection imaging system 150 will be shown and described together with the entire detection system. Following the FIG. 1, only three secondary electron beams with respect to the three probe spots are shown although the number of secondary electron beams can be anyone. Within the entire detection system, starting from the sample 8, the first part is along the primary optical axis 100_1, and the second part is along the secondary optical axis 150_1. For sake of clarity, the first part is rotated to along the secondary optical axis 150_1 and therefore the entire detection system can be shown along one straight optical axis.

FIG. 2 shows one embodiment 150-1 of the secondary projection imaging system 150 in the detection system 100-1D. The embodiment 150-1 includes the zoom lens 151, the projection lens 152 and the anti-scanning deflection unit 157 all aligned with the secondary optical axis 150_1. The detection elements 140_1, 140_2 and 140_3 of the electron detection device 140 are placed on the detection plane SP3. The zoom lens 151, the projection lens 152 and the objective lens 131 together project the sample surface 7 onto the detection plane SP3, i.e. focus the secondary electron beams 102_1se~102_3se to form secondary-electron spots on the detection elements 140_1, 140_2 and 140_3 respectively when the deflection scanning unit 132 is off. The anti-scanning deflection unit 157 keeps the secondary-electron spots within the corresponding detection elements during the deflection scanning unit 132 scans the beamlets 102_1~102_3 over the three scanned regions.

The total imaging magnification M from the sample surface 7 to the detection plane SP3 is chosen in terms of Pd and Ps as the equation (1).

$$M = \frac{Pd}{Ps} \tag{1}$$

In this way each probe spot on the sample surface is imaged onto one detection element, and thereby ensuring the corresponding relationship between the plurality of probe spots and the plurality of detection elements. The probe spot pitch Pd may be different for different inspection applications, and the magnification M will always be changed accordingly.

The zoom lens 151 comprises two electrostatic lenses 151_11 and 151_12. The image plane of the zoom lens 151 is always at the transfer plane SP2. The positions of the transfer plane SP2 in SSE mode and BSE mode are different and fixed. The projection lens 152 comprises one electrostatic lens 152_11 and one magnetic lens 152_12, and the image plane thereof is always at the detection plane SP3. The first imaging magnification M1 from the sample surface 7 to the transfer plane SP2 is realized by the objective lens 131 and the zoom lens 151, the second imaging magnification M2 from the transfer plane SP2 to the detection plane SP3 is realized by the projection lens 152, and the total imaging magnification M from the sample surface 7 to the detection plane SP3 is equal to M1*M2. The second imaging magnification M2 is preferred larger than the first imaging magnification M1 in the SSE mode.

The zoom lens 151 performs the zoom function. By adjusting the focusing powers of the two electrostatic lenses 151_11 and 151_12, the imaging magnification M1 can be varied to achieve the desired value of the total imaging magnification M. The projection lens 152 performs the anti-rotating function. By adjusting the magnetic field of the magnetic lens 152_12 and the focusing power of the electrostatic lens 152_11, the total image rotation on the detection plane SP3 and the imaging magnification M2 can always remain the same. The anti-scanning deflection unit 157 performs the anti-scanning function. By synchronously deflecting the secondary electron beams with the deflection scanning unit 132, the displacements of three secondary-electron spots on the detection plane SP3 can be substantially canceled. Consequently the corresponding relationship between the plurality of probe spots and the plurality of detection elements can always be kept. Basically the anti-scanning deflection unit 157 can be placed at any place before the detection plane SP3. To reduce the additional aberrations of the zoom lens 151 and the projection lens 152, which come from the deflection of the secondary electron beams generated by the deflection scanning unit 132, the anti-scanning deflection unit 157 is better placed before the zoom lens 151 and hence the secondary electron beams will pass through the zoom lens 151 and the projection lens 152 in a way as if the deflection scanning unit 132 is off. However, in this case, the zoom lens 151 has to be placed far away from the beam separator 160 and consequently generates large initial aberrations. Placing anti-scanning deflection unit 157 between the electrostatic lenses 151_11 and 151_12 of the zoom lens 151 is a preferred balance for reducing both the initial aberrations and the additional aberrations, as the embodiment 150-2 of the secondary projection imaging system 150 in the detection system 100-2D in FIG. 3A.

FIG. 3B shows how the detection system 100-2D works in SSE mode. At first, the objective lens 131 focuses the three slow secondary electron beams 102_1sse, 102_2sse and 102_3sse from the three probe spots 102_1S, 102_2S and 102_3S and forms the first secondary-electron images of the three probe spots on the image plane SP1_sse. The image plane SP1_sse is below the zoom lens 151 and moves with the changes of the operation conditions of the objective lens 131. The beam separator 160 deflects the three slow secondary electron beams 102_1sse~102_3sse to enter the secondary projection imaging system 150-2 along the secondary optical axis 150_1. The zoom lens 151 then focuses the three slow secondary electron beams 102_1sse~102_3sse and forms the second secondary-electron images of the three probe spots on the transfer plane SP2. The projection lens 152 focuses the three slow secondary electron beams 102_1sse~102_3sse to form the third secondary-electron images of the three probe spots on the detection plane SP3, which then form three slow secondary-electron spots 102_1sseP, 102_2sseP and 102_3sseP respectively inside three detection elements 140_1, 140_2 and 140_3. In BSE Mode, the detection system 100-2D works in the same way but the positions of the image plane SP1_sse and the transfer plane SP2 will be different from those in SSE mode.

Figure 4A:
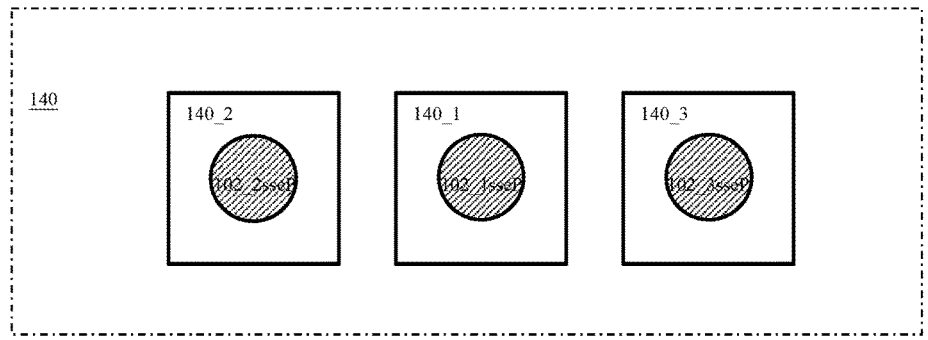
FIGS. 4A~4C are schematic illustrations of the secondary-electron spots on the electron detection device in FIG. 3B.
Figure 4B:
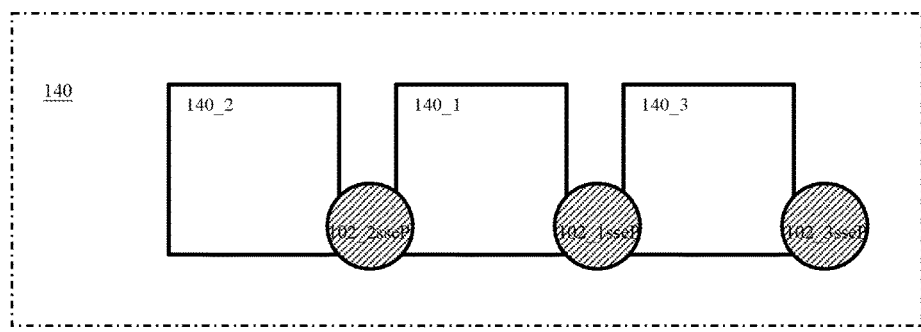

The anti-scanning deflector unit 157 compensates the influence of the deflection scanning unit 132 on the three slow secondary electron beams 102_1sse~102_3sse. When the deflection scanning unit 132 deflects the three beamlets to scan the corresponding scanned regions on the sample surface 7, the three slow secondary electron beams 102_1sse·102_3sse are deflected either. On the detection plane SP3, the deflection shifts the slow secondary-electron spots 102_1sseP~102_3sseP from the original positions shown in FIG. 4A to new positions such as those in FIG. 4B. On the one hand, the collection efficiency of each slow secondary electron beam decreases because a part of the slow secondary-electron spot thereof is not inside the corresponding detection element. On the other hand, two slow secondary-electron spots are partially inside one detection element at the same time, such as 102_1sseP and 102_2sseP inside 140_1. The image signal from one detection element includes information from more than one scanned region on the sample surface 7, thus the cross-talk occurs.

To avoid the cross-talk, the anti-scanning deflector unit 157 needs to deflect the three slow secondary electron beams to cancel the shifts of the slow secondary-electron spots on the detection plane SP3. One embodiment 157-1 of the anti-scanning deflector unit 157 is shown in FIG. 5, which includes two (can be more) anti-scanning deflectors 157_11 and 157_12. The embodiment 157-1 works in the same way in both the SSE mode and the BSE mode, and here the slow secondary electron beam 102_1sse is taken as an example. When the deflection scanning unit 132 does not deflects the three beamlets, the slow secondary electron beam 102_1sse passes the zoom lens 151 and the projection lens 152 along the secondary optical axis 150_1 and hits the center of the detection element 140_1, and the path is shown in heavy line. When the deflection scanning unit 132 deflects the three beamlets to some places away from the centers of the corresponding scanned regions on the sample surface 7, the slow secondary electron beam 102_1sse both shifts from and tilts to the secondary optical axis 150_1 when entering the electrostatic lenses 151_11, and the path is shown in fine line. If the anti-scanning deflector unit 157 is not employed, the slow secondary electron beam 102_1sse passes through the electrostatic lenses 151_12 and the projection lens 152 along the path in dash line and partially hits the detection element 140_1. The off-axis aberrations of the electrostatic lenses 151_12 and the projection lens 152 increase, and the slow secondary-electron spot 102_1sseP therefore becomes large. The enlarged spot makes the cross-talk worse. If the anti-scanning deflector unit 157 is employed, the first anti-scanning deflector 157_11 deflects the slow secondary electron beam 102_1sse to substantially pass the center of the second anti-scanning deflector 157_12, and the second anti-scanning deflector 157_12 therefore can deflect the slow secondary electron beam 102_1sse back to travel along the secondary optical axis 150_1. In this way, the slow secondary electron beam 102_1sse will pass through the electrostatic lenses 151_12 and the projection lens 152 along the path same as that when the deflection scanning unit 132 does not deflects the three beamlets, i.e. travelling along the heavy line and hits the center of the detection element 140_1.

Figure 4C:
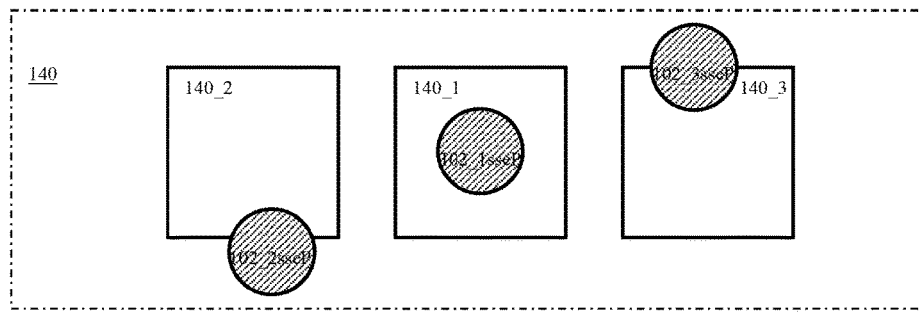

The magnetic lens 152_12 of the projection lens 152 compensates the influence of the objective lens 131 on the rotations of the three slow secondary electron beams 102_1sse~102_3sse. If the objective lens 131 comprises one magnetic lens, the three slow secondary electron beams will rotate around the primary optical axis 100_1 when passing through the magnetic lens, and the rotation angle will change with the magnetic field thereof. Thus, when the magnetic field is changed due to some reasons (such as the changes of the landing energies of the three beamlets 102_1~102_3), the three slow secondary-electron spots 102_1sseP~102_3sseP will rotate around the secondary optical axis 150_1 from the original positions in FIG. 4A to new positions such as those in FIG. 4C. Accordingly the collection efficiency of three slow secondary electron beams 102_1sse~102_3sse decreases and the cross-talk will appear if the beamlets are arranged in a 2D array. In this case, the magnetic field of the magnetic lens 152_12 will be adjusted to rotate the three slow secondary electron beams 102_1sse~102_3sse in the opposite direction to cancel the rotation variation of the three slow secondary-electron spots 102_1sseP~102_3sseP due to the change of the magnetic field of the objective lens 131.

FIGS. 6A-6C respectively show one configuration of the projection lens 152 which can perform the anti-rotating function. In the configuration 152-1 of FIG. 6A, the electrostatic lens 152_11 is inside the magnetic lens 152_12, and comprises three electrodes 152_11_e1, 152_11_e2 and 152_11_e3. The electrostatic lens 152_11 can perform as an einzel lens. Due to the electrostatic field of the electrostatic lens 152_11 and the magnetic field of the magnetic lens 152_12 are separated to a great degree, the imaging magnification M2 will change with the magnetic field variation of the magnetic lens 152_12. Hence the zoom lens 151 needs to compensate the variation of the imaging magnification M2 when the magnetic lens 152_12 is adjusted to perform the anti-rotating function. To avoid this complicated procedure, the electrostatic field center of the electrostatic lens 152_11 and the magnetic field center of the magnetic lens 152_12 are preferred coincident, as the embodiment 152-2 shown in FIG. 6B. If both electrodes 152_11_e3 and 152_11_e1 are grounded, they can be replaced by the upper and lower pole-pieces of the magnetic lens 152_12, as the embodiment 152-3 shown in FIG. 6C.

To get high collection efficiency and low cross-talk level, obviously it is better to make the secondary-electron spots as small as possible, i.e. reduce the aberrations of the zoom lens 151 and the projection lens 152 as much as possible. One solution is using a field lens to reduce the aberrations of the off-axis secondary-electron spots. In FIG. 3B, the two off-axis slow secondary electron beams 102_2sse and 102_3sse enter the projection lens 152 with large radial shifts and tilt angles, and accordingly have large off-axis aberrations. FIG. 7A shows one embodiment 150-3 of the secondary projection imaging system 150 in the detection system 100-3D. In FIG. 7A, the field lens 153 and the field lens 154 are respectively placed at the transfer plane SP2_1 of the SSE mode and the transfer plane SP2_2 of the BSE mode, and both are aligned with secondary optical axis 150_1. If the secondary projection imaging system 150 is only required to work in one of the SSE mode and the BSE mode, only the corresponding field lens is placed there. FIG. 7B shows how the field lens 153 works in the SSE mode. In comparison with FIG. 3B, the field lens 153 bends the slow secondary electron beams 102_2sse and 102_3sse toward the secondary optical axis 105_1 without influencing the on-axis slow secondary electron beams 102_1sse and the total imaging magnification M. In FIG. 7B, the secondary electron beams 102_2sse and 102_3sse are bent to pass through the center of the projection lens 152, i.e. the radial shifts are almost eliminated but the tilt angles are large. Actually the field lens 153 can be adjusted to balance the radial shifts and the tilt angles so as to make the slow secondary-electron spots 102_2sseP and 102_3sseP as small as possible.

Another solution is using a beam-limit aperture to cut off the peripheral electrons of one secondary electron beam because the peripheral electrons usually have large aberrations. FIG. 8A shows one embodiment 150-4 of the secondary projection imaging system 150 in the detection system 100-4D, wherein the secondary beam-limit aperture plate 155 with one opening 155_A is placed above the projection lens 152. The opening 155_A is aligned with the secondary optical axis 150_1 and at or close to the last crossover of the secondary electron beams 102_1se~102_3se. FIG. 8B shows how the opening 155_A works in the SSE mode. In comparison with FIG. 3B, the opening 155_A is placed at the last crossover CO3 and therefore can cut off the peripheral electrons of the three slow secondary electron beams 102_1sse~102_3sse together. Due to the positions of the crossovers in the SSE mode and the BSE mode are different and change with the landing energies of the beamlets 102_1~102_3 and the operation conditions of the objective lens 131, the opening 155_A can only work very well for some application cases if not moving to match the position of the corresponding crossover. FIG. 9A shows one embodiment 150-5 of the secondary projection imaging system 150 in the detection system 100-5D, wherein the positions of the last crossovers in the SSE mode and BSE mode are fixed at the same place and hence the opening 155_A of the beam-limit aperture plate 155 has a good performance for all the application cases.

Similar to FIG. 7A, in FIG. 9A the field lens 153 and the field lens 154 are respectively placed at the transfer plane SP2_1 of the SSE mode and the transfer plane SP2_2 of the BSE mode, and both are aligned with secondary optical axis 150_1. If the secondary projection imaging system 150 is only required to work in one of the SSE mode and the BSE mode, only the corresponding field lens is placed there. In each of the SSE mode and the BSE mode, the corresponding field lens bends the off-axis secondary electron beams to make the last crossover thereof at or very close to the opening 155_A. In the SSE mode as shown in FIG. 9B, the field lens 154 is off or absent and the field lens 153 bends the slow secondary electron beams 102_2sse and 102_3sse toward the secondary optical axis 150_1 to pass through the opening 155_A. In the BSE mode as shown in FIG. 9C, the field lens 153 is off or absent and the field lens 154 bends the backscattered electron beams 102_2be and 102_3be toward the secondary optical axis 150_1 to pass through the opening 155_A. In the SSE mode and the BSE mode, the field lens 153 and the field lens 154 reduce the aberrations of the projection lens 152 and keep the position of the last crossover at the same time.

The smaller the radial size of the opening 155_A is used, the lower the collection efficiencies and the less cross-talks of the image signals of the detection elements 140_1, 140_2 and 140_3 will be. Hence the radial size is chosen by balancing the collection efficiency and the cross-talk level. The optimal radial sizes in the SSE mode and the BSE mode may be different. To enable each mode work with the optimal radial size thereof, the beam-limit aperture plate 155 can have two or more openings, as the embodiment 150-6-1 of the secondary projection imaging system 150 in the detection system 100-6-1D shown in FIG. 10A. In FIG. 10A, the beam-limit aperture plate 155 has two openings 155_1 and 155_2 and can be moved perpendicular to the secondary optical axis 150_1. The opening 155_1 and the opening 155_2 have the optimal radial sizes for the SSE mode and BSE mode respectively. When the embodiment 150-6 works in the SSE mode, the beam-limit aperture plate 155 is moved to align the opening 155_1 with the secondary optical axis 150_1. When the embodiment 150-6 works in the BSE mode, the beam-limit aperture plate 155 is moved to align the opening 155_2 with the secondary optical axis 150_1. If the beam-limit aperture plate 155 has two or more openings with different radial sizes for each mode, the collection efficiency and the cross-talk level can be balanced to different degrees.

For some applications, the optimal positions of the last crossovers of the secondary electron beams in the SSE mode and BSE mode may be different. Accordingly two separate secondary beam-limit aperture plates can be used, which are placed at different positions along the secondary optical axis 150_1 and above the projection lens 152, as the embodiment 150-6-2 of the secondary projection imaging system 150 in the detection system 100-6-2D shown in FIG. 10B. In FIG. 10B, the first secondary beam-limit aperture plate 155 and the second secondary beam-limit aperture plate 156 are respectively placed at the optimal positions of the last crossovers of the secondary electron beams in the SSE mode and the BSE mode, and each can have one or more openings with different radial sizes for differently balancing the collection efficiency and the cross-talk level. In the SSE mode, the field lens 153 bends the slow secondary electron beams 102_2sse and 102_3sse (refer to FIG. 9B) to form one crossover at one opening of the first secondary beam-limit aperture plate 155, wherein the opening is aligned with the secondary optical axis 150_1 and has a desired radial size and accordingly the second secondary beam-limit aperture plate 156 can be moved away or to align one large enough opening thereof with the secondary optical axis 150_1. In the BSE mode, the field lens 154 bends the backscattered electron beams 102_2be and 102_3be (refer to FIG. 9C) to form one crossover at one opening of the second secondary beam-limit aperture plate 156, wherein the opening is aligned with the secondary optical axis 150_1 and has a desired radial size and accordingly the first secondary beam-limit aperture plate 155 can be moved away or to align one large enough opening thereof with the secondary optical axis 150_1.

The beam separator 160 generates astigmatism when deflecting the secondary electron beams 102_1se~102_3se to enter the secondary projection imaging system 150 along the secondary optical axis 150_1. The astigmatism enlarges the secondary-electron spots on the detection plane SP3, and thereby decreasing the collection efficiency and increasing the cross-talk. One stigmator can be used to compensate the astigmatism. For equally influencing all the secondary electron beams, the stigmator is better placed at or close to a crossover of the secondary electron beams. If the secondary projection imaging system 150 is only required to work in one of the SSE mode and the BSE mode, the stigmator can be at or close to one of the second last crossover (CO2 in FIG. 8B) and the last crossover (CO3 in FIG. 8B), as the embodiment 150-7 of the secondary projection imaging system 150 in the detection system 100-7D shown in FIG. 11A. In FIG. 11A, the stigmator 158 is placed at the second last crossover below the transfer plane SP2. FIG. 11B shows where the stigmator 158 is for the SSE mode.

If the secondary projection imaging system 150 is required to work in each of the SSE mode and the BSE mode, the stigmator is better at or close to the last crossover. The positions of the second last crossovers in the SSE mode and the BSE mode obviously separate and one stigmator can not work for both. Hence two stigmators have to be placed at or close to the second last crossovers in the SSE mode and the BSE mode respectively. Due the positions of the last crossovers in the SSE mode and the BSE mode can be adjusted to the same place by the field lenses thereof, the SSE mode and the BSE mode can simply share one stigmator, as the embodiment 150-8 of the secondary projection imaging system 150 in the detection system 100-8D shown in FIG. 12.

Similar to Similar to FIG. 9A, in FIG. 12 the field lens 153 and the field lens 154 are respectively placed at the transfer plane SP2_1 of the SSE mode and the transfer plane SP2_2 of the BSE mode, and both are aligned with secondary optical axis 150_1. In each of the SSE mode and the BSE mode, the corresponding one of the field lenses 153 and 154 bends the secondary electron beams to make the last crossover thereof at or very close to the opening 155_A of the secondary beam-limit aperture plate 155. The stigmator 158 is aligned with the secondary optical axis 150_1 and close to (above or below) the secondary beam-limit aperture plate 155.

In the foregoing embodiments of the secondary projection imaging system 150, the anti-rotating function is done by the projection lens 152. In fact, the anti-rotating function can be performed by the zoom lens 151, or the corresponding field lens (153 or 154), or one extra magnetic lens. In the embodiment 150-9-1 of the secondary projection imaging system 150 of the detection system 100-9-1D shown in FIG. 13A, the field lens 153 comprises one electrostatic lens 153_11 and one magnetic lens 153_12. The magnetic field of the magnetic lens 153_12 is adjusted to realize the anti-rotating function, and the desired bending function of the field lens 153 is done by adjusting the focusing power of the electrostatic lens 153_11 on the base of the magnetic field of the magnetic lens 153_12. In the embodiment 150-9-2 of the secondary projection imaging system 150 of the detection system 100-9-2D shown in FIG. 13B, one magnetic lens 151_13 is added to the electrostatic lens 151_12 of the zoom lens 151 and thereby forming the electromagnetic compound lens 151_12c. Similarly, the magnetic lens 151_13 can also be added to the electrostatic lens 151_11 to form one electromagnetic compound lens 151_11c or simply placed between the two electrostatic lenses 151_11 and 151_12. The magnetic field of the magnetic lens 151_13 is adjusted to realize the anti-rotating function, and the desired zoom function of the zoom lens 151 is done by adjusting the focusing powers of the electrostatic lenses 151_11 and 151_12 on the base of the magnetic field of the magnetic lens 151_13. The field lens 153 in FIG. 13A and the electromagnetic compound lens 151_12c in FIG. 13B or the electromagnetic compound lens 151_11c (not shown) respectively can employ one of the configurations of the projection lens 152 shown in FIGS. 6A-6C.

In the foregoing embodiments of the secondary projection imaging system 150, the zoom lens 151, the projection lens 152 and the center detection element (140_1 here) of the electron detection device 140 are aligned with the secondary optical axis 150_1. In reality, it is hardly possible to manufacture all of them perfectly and assemble all of them exactly at the right places thereof, and hence the secondary-electron spots on the detection plane SP3 possibly shift away from the corresponding detection elements. To make the secondary-electron spots coincident with the corresponding detection elements, either moving the electron detection device 140 or moving the secondary-electron spots. Comparatively moving the secondary-electron spots is simply and flexible. To do so, one alignment deflector can be placed above the projection lens 152 in the foregoing embodiments of the secondary projection imaging system 150 to deflect the secondary electron beams to move the secondary-electron spots with respect to real position of the electron detection device 140. For example, one alignment deflector 159 is placed above the projection lens 152 of the embodiment 150-7 in FIG. 11A and shown in FIG. 14. The new embodiment in FIG. 14 is named as 150-10. FIG. 14 further shows if one secondary beam-limit aperture plate 155 is used, the alignment deflector 159 is placed thereover. For the embodiments of the secondary projection imaging system 150, which employ one stigmator above the projection lens 152 (such as FIG. 12), the stigmator can be designed to have a multipole structure which can function as one stigmator and one alignment deflector simultaneously.

Figure 15A:
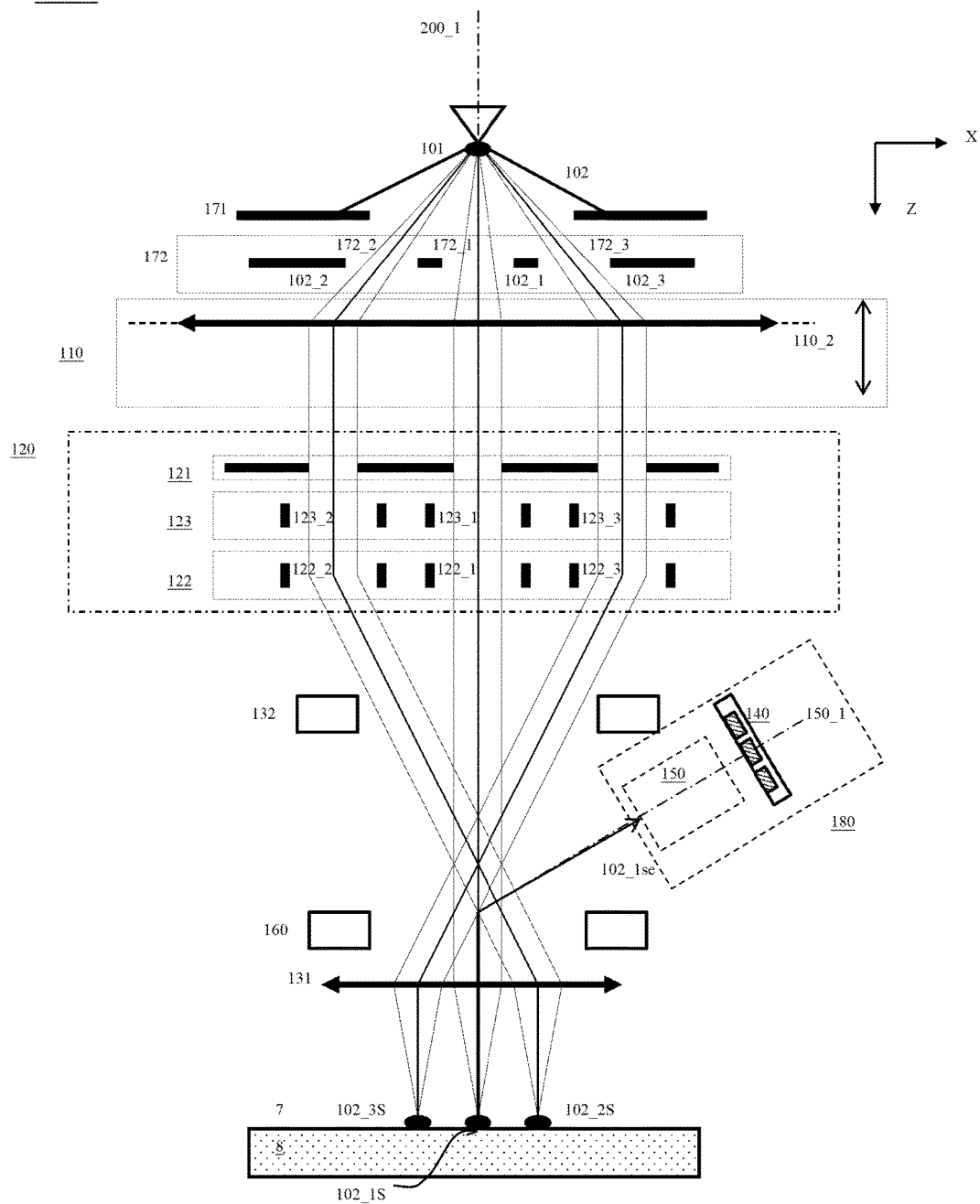
FIG. 15A is a schematic illustration of a configuration of a multi-beam apparatus in accordance with another embodiment of the present invention.

In FIG. 1, the deflection scanning unit 132 below the beam separator 160 and thereby influencing the secondary electron beams 102_1se~102_3se. Accordingly, for the displacement of one secondary-electron spot on the detection plane SP3, the first portion comes from the displacement of the corresponding probe spot on the sample surface 7 and the total magnification M, and the second portion is due to the deflection influence of the deflection scanning unit 132. If the deflection scanning unit 132 is above the beam separator 160, as the embodiment 200A of the multi-beam apparatus in FIG. 15, the second portion will not exist. In this case, the secondary projection imaging system 150 can take any of the foregoing embodiments. In FIG. 15B, one embodiment 200-1D of the corresponding detection system employs the embodiment 151-2 shown in FIG. 3A, wherein the anti-scanning deflection unit 157 only needs to cancel the first portions of the displacements of the secondary-electron spots. Furthermore, if the sizes of each scanned region are smaller than the pitch Pd and each of the adjacent probe spots to a certain degree, the anti-scanning deflection unit 157 can even be removed.

In summary, the object of this invention is to provide a secondary projection imaging system of a multi-beam apparatus, which makes the secondary electron detection with both high collection efficiency and low cross-talk level even if the landing energies and/or currents of the plural beamlets change within large ranges. As a yield management tool in semiconductor manufacturing industry, the multi-beam apparatus therefore can achieve high inspection resolution and high inspection throughput in many application conditions. The secondary projection imaging system basically employs one zoom lens, one projection lens and one anti-scanning deflection unit. With respect to the variations in landing energies of the plural beamlets and the corresponding operation conditions of the objective lens of the multi-beam apparatus, the zoom lens and the projection lens respectively perform the zoom function and the anti-rotating function to remain the total imaging magnification and the total image rotation from the sample surface to the detection plane, and hence the plural detection elements of the electron detection device at the detection plane can respectively detect the plural secondary electron beams generated by the plural beamlets. The anti-scanning deflection unit performs the anti-scanning function, which synchronously deflects the secondary electron beams to remain the landing positions of the plural secondary electron beams on the detection plane when the deflection scanning unit scans the plural beamlets over the small scanned regions. The secondary projection imaging system can further use one field lens and/or a secondary beam-limit aperture to reduce the sizes of the plural secondary electron beams on the detection plane, and therefore increase the collection efficiencies of the plural secondary electron beams and reduce the cross-talks among the plural secondary electron beams. The secondary projection imaging system can also use one alignment deflector to eliminate the mismatch of the plural secondary electron beams and the plural detection elements which comes from the manufacturing and/or assembly errors of the zoom lens, the projection lens and the electron detection device. The zoom lens or the field lens can also perform the anti-rotating function if using one magnetic lens therein.

Although the present invention has been explained in relation to its preferred embodiment, it is to be understood that other modifications and variation can be made without departing the spirit and scope of the invention as hereafter claimed.

What is claimed is:

1. A multi-beam apparatus for observing a surface of a sample, comprising:
   an electron source;
   a condenser lens below said electron source;
   a source-conversion unit below said condenser lens;
   an objective lens below said source-conversion unit;
   a deflection scanning unit below said source-conversion unit;
   a sample stage below said objective lens;
   a beam separator below said source-conversion unit; and
   a detection unit above said beam separator and comprising a secondary projection imaging system and an electron detection device with a plurality of detection elements,
   wherein said electron source, said condenser lens, said source-conversion unit, said objective lens, said deflection scanning unit and said beam separator are aligned with a primary optical axis of said apparatus, said sample stage is configured to sustain said sample so that said surface faces to said objective lens, said detection unit is aligned with a secondary optical axis of said apparatus, and said secondary optical axis is not parallel to said primary optical axis,
   wherein said plurality of detection elements is placed on a detection plane, said secondary projection imaging system comprises a zoom lens, an anti-scanning deflection unit and a projection lens,
   wherein said electron source is configured to generate a primary electron beam along said primary optical axis, said condenser lens is configured to focus said primary electron beam, said source-conversion unit is configured to change said primary electron beam into a plurality of beamlets and make said plurality of beamlets form a plurality of first images of said electron source, said objective lens is configured to focus said plurality of beamlets to image said plurality of first images onto said surface and therefore form a plurality of probe spots thereon respectively, and said deflection scanning unit is configured to deflect said plurality of beamlets to scan said plurality of probe spots respectively over a plurality of scanned regions within an observed area on said surface,
   wherein a plurality of secondary electron beams is generated by said plurality of probe spots respectively from said plurality of scanned regions and then incident to said objective lens, said objective lens is configured to in passing focus said plurality of secondary electron beams, and said beam separator is configured to deflect said plurality of secondary electron beams to enter said secondary projection imaging system along said secondary optical axis,
   wherein said zoom lens is configured to focus said plurality of secondary electron beams onto a transfer plane, said transfer plane is between said zoom lens and said projection lens, and said plurality of secondary electron beams is configured to form a first crossover between said zoom lens and said transfer plane,
   wherein said projection lens is configured to focus said plurality of secondary electron beams onto said detection plane, said plurality of secondary electron beams is configured to form a second crossover between said projection lens and said detection plane and a plurality of secondary-electron spots on said detection plane, said plurality of secondary-electron spots is inside said plurality of detection elements respectively, consequently a corresponding relationship between said plurality of probe spots and said plurality of detection elements is established, and accordingly each detection element is configured to generate an image signal of one corresponding scanned region,
   wherein said anti-scanning deflection unit is configured to deflect said plurality of secondary electron beams in step with said plurality of probe spots scanning over said plurality of scanned regions to remain positions of said plurality of secondary-electron spots and thereby keeping said corresponding relationship all the time,
   wherein an imaging magnification of said zoom lens is configured to be adjusted to keep said corresponding relationship when observing said surface in different conditions.

2. The apparatus according to claim 1, further comprising a secondary beam-limit aperture to cut off peripheral electrons of said plurality of secondary electron beams.

3. The apparatus according to claim 1, further comprising a field lens placed at said transfer plane to reduce off-axis aberrations of said projection lens.

4. The apparatus according to claim 1, further comprising a stigmator to compensate astigmatism aberrations of said plurality of secondary electron beams due to said beam separator.

5. The apparatus according to claim 1, further comprising an alignment deflector to compensate a deviation of said corresponding relationship due to manufacturing and/or assembly errors of said detection unit.

6. The apparatus according to claim 1, wherein said anti-scanning deflection unit is between said beam separator and said zoom lens.

7. The apparatus according to claim 1, wherein said zoom lens comprises a first zoom sub-lens and a second zoom sub-lens, and said second zoom sub-lens is between said first zoom sub-lens and said transfer plane.

8. The apparatus according to claim 7, wherein said anti-scanning deflection unit is between said first and second zoom sub-lenses.

9. The apparatus according to claim 8, wherein said anti-scanning deflection unit is configured to deflect said plurality of secondary electron beams incident to said second zoom sub-lens along said secondary optical axis.

10. The apparatus according to claim 9, wherein said secondary projection imaging system comprises a field lens placed at said transfer plane to reduce radial shifts and tilt angles of said plurality of secondary electron beams incident to said projection lens.

11. The apparatus according to claim 9, wherein said secondary projection imaging system comprises a secondary beam-limit aperture plate with one or more openings, and said one or one of said more opening is placed at a position of said second crossover to cut off peripheral electrons of said plurality of secondary electron beams.

12. The apparatus according to claim 11, wherein said secondary projection imaging system comprises a field lens placed at said transfer plane to bend said plurality of secondary electron beams to keep said position of said second crossover when observing said surface in different conditions.

13. The apparatus according to claim 12, wherein said secondary projection imaging system comprises a stigmator placed at or close to said first crossover to compensate astigmatism aberrations of said plurality of secondary-electron spots due to said beam separator.

14. The apparatus according to claim 13, wherein said objective lens has a first magnetic lens.

15. The apparatus according to claim 14, wherein said field lens has a second magnetic lens which is configured to cancel rotation variations of said plurality of secondary-electron spots when observing said surface in different conditions.

16. The apparatus according to claim 14, wherein said zoom lens has a second magnetic lens which is configured to cancel rotation variations of said plurality of secondary-electron spots when observing said surface in different conditions.

17. The apparatus according to claim 14, wherein said projection lens has a second magnetic lens which is configured to cancel rotation variations of said plurality of secondary-electron spots when observing said surface in different conditions.

18. The apparatus according to claim 17, wherein said secondary projection imaging system comprises an alignment deflector, which is between said secondary beam-limit aperture plate and said detection plane to compensate a deviation of said corresponding relationship due to manufacturing and/or assembly errors of said detection unit.

19. The apparatus according to claim 18, wherein said plurality of secondary electron beams is a plurality of slow secondary electron beams respectively.

20. The apparatus according to claim 18, wherein said plurality of secondary electron beams is a plurality of backscattered electron beams respectively.

21. A multi-beam apparatus for observing a surface of a sample, comprising:
an electron source;
a condenser lens below said electron source;
a source-conversion unit below said condenser lens;
an objective lens below said a source-conversion unit;
a deflection scanning unit below said source-conversion unit;
a sample stage below said objective lens;
a beam separator below said a source-conversion unit; and
a detection unit above said beam separator and comprising a secondary projection imaging system and an electron detection device with a plurality of detection elements,
wherein said electron source, said condenser lens, said source-conversion unit, said objective lens, said deflection scanning unit and said beam separator are aligned with a primary optical axis of said apparatus, said sample stage is configured to sustain said sample so that said surface faces to said objective lens, said detection unit is aligned with a secondary optical axis of said apparatus, and said secondary optical axis is not parallel to said primary optical axis,
wherein said plurality of detection elements is placed on a detection plane, said secondary projection imaging system comprises a zoom lens, an anti-scanning deflection unit, projection lens, a first field lens at a first transfer plane and a second field lens at a second transfer plane, said first and second field lens are between said zoom lens and said projection lens, and said first field lens is between said second field lens and said projection lens,
wherein said electron source is configured to generate a primary electron beam along said primary optical axis, said condenser lens is configured to focus said primary electron beam, said source-conversion unit is configured to change said primary electron beam into a plurality of beamlets and make said plurality of beamlets form a plurality of first image of said electron source, said objective lens is configured to focus said plurality of beamlets to image said plurality of first images onto said surface and therefore form a plurality of probe spots thereon respectively, and said deflection scanning unit is configured to deflect said plurality of beamlets to scan said plurality of probe spots respectively over a plurality of scanned regions within an observed area on said surface,
wherein a plurality of slow secondary electron beams and a plurality of backscattered electron beams are generated by said plurality of probe spots respectively from said plurality of scanned regions and then incident to said objective lens, said objective lens is configured to in passing focus said plurality of slow secondary electron beams and said plurality of backscattered electron beams,
wherein said detection unit is configured to separately operate on a SSE mode and a BSE mode when said beam separator respectively deflects said plurality of slow secondary electron beams and said plurality of backscattered electron beams to enter said secondary projection imaging system along said secondary optical axis,
wherein in said SSE mode, said second field lens is turned off, said zoom lens is configured to focus said plurality of slow secondary electron beams onto said first transfer plane, said first field lens is configured to bend said plurality of slow secondary electron beams towards said secondary optical axis, said projection lens is configured to focus said plurality of slow secondary electron beams onto said detection plane, said plurality of slow secondary electron beams is configured to then form a SSE crossover between said projection lens and said detection plane and a plurality of slow-secondary-electron spots on said detection plane, said plurality of slow-secondary-electron spots is inside said plurality of detection elements respectively, consequently a SSE corresponding relationship between said plurality of probe spots and said plurality of detection elements is established, and accordingly each detection element is configured to generate a SSE image signal of one corresponding scanned region, wherein in said BSE mode, said first field lens is turned off, said zoom lens is configured to focus said plurality of backscattered electron beams onto said second transfer plane, said second field lens is configured to bend said plurality of backscattered electron beams towards said secondary optical axis, said projection lens is configured to focus said plurality of backscattered electron beams onto said detection plane, said plurality of backscattered electron beams is configured to then form a BSE crossover between said projection lens and said detection plane and a plurality of backscattered-electron spots on said detection plane, said plurality of backscattered-electron spots is inside said plurality of detection elements respectively, consequently a BSE corresponding relationship between said plurality of probe spots and said plurality of detection elements is established, and accordingly each detection element is configured to generate a BSE image signal of one corresponding scanned region, wherein in said SSE mode, said anti-scanning deflection unit is configured to deflect said plurality of slow secondary electron beams in step with said plurality of probe spots scanning over said plurality of scanned regions to remain positions of said plurality of slow-secondary-electron spots and thereby keeping said SSE corresponding relationship all the time, wherein in said BSE mode, said anti-scanning deflection unit is configured to deflect said plurality of backscattered electron beams in step with said plurality of probe spots scanning over said plurality of scanned regions to remain positions of said plurality of backscattered-electron spots and thereby keeping said BSE corresponding relationship all the time, wherein when observing said surface in different conditions, an imaging magnification of said zoom lens is configured to be adjusted to keep said SSE and BSE corresponding relationships in said SSE and BSE modes respectively.

22. The apparatus according to claim 21, wherein said secondary projection imaging system comprises a first secondary beam-limit aperture placed at said SSE crossover to cut off peripheral electrons of said plurality of slow secondary electron beams in said SSE mode.

23. The apparatus according to claim 21, wherein said secondary projection imaging system comprises a second secondary beam-limit aperture placed at said BSE crossover to cut off peripheral electrons of said plurality of backscattered electron beams in said BSE mode.

24. The apparatus according to claim 21, wherein said secondary projection imaging system comprises a first stigmator to compensate astigmatism aberrations of said plurality of slow secondary electron beams due to said beam separator in said SSE mode.

25. The apparatus according to claim 21, wherein said secondary projection imaging system comprises a second stigmator to compensate astigmatism aberrations of said plurality of backscattered electron beams due to said beam separator in said BSE mode.

26. The apparatus according to claim 21, wherein said secondary projection imaging system comprises an alignment deflector, and in said SSE mode and said BSE mode said alignment deflector is configured to compensate deviations of said SSE corresponding relationship and said BSE corresponding relationship respectively due to manufacturing and/or assembly errors of said detection unit.

27. The apparatus according to claim 21, wherein said anti-scanning deflection unit is between said beam separator and said zoom lens.

28. The apparatus according to claim 21, wherein said zoom lens comprises a first zoom sub-lens and a second zoom sub-lens, and said second zoom sub-lens is between said first zoom sub-lens and said second field lens.

29. The apparatus according to claim 28, wherein said anti-scanning deflection unit is between said first and second zoom sub-lenses.

30. The apparatus according to claim 29, wherein said anti-scanning deflection unit is configured to respectively deflect said plurality of slow secondary electron beams in said SSE mode and said plurality of backscattered electron beams in said BSE mode incident to said second zoom sub-lens along said secondary optical axis.

31. The apparatus according to claim 30, wherein said secondary projection imaging system comprises a first secondary beam-limit aperture plate and a second secondary beam-limit aperture plate each having one or more openings.

32. The apparatus according to claim 31, wherein in said SSE mode one opening of said first secondary beam-limit aperture plate is placed at said SSE crossover to cut off peripheral electrons of said plurality of slow secondary electron beams, and in said BSE mode one opening of said second secondary beam-limit aperture plate is placed at said BSE crossover to cut off peripheral electrons of said plurality of backscattered electron beams.

33. The apparatus according to claim 30, wherein said SSE crossover and said BSE crossover are set at a common position by adjusting said first field lens and said second field lens respectively.

34. The apparatus according to claim 33, wherein said secondary projection imaging system comprises a third secondary beam-limit aperture plate with one or more openings, and said one or one of said more openings is placed at said common position in each of said SSE mode and said BSE mode.

35. The apparatus according to claim 34, wherein said secondary projection imaging system comprises a stigmator placed close to said third secondary beam-limit aperture plate, the stigmator being configured to compensate astigmatism aberrations of said plurality of slow-secondary-electron spots and said plurality of backscattered-electron spots in said SSE mode and said BSE mode respectively due to said beam separator.

36. The apparatus according to claim 35, wherein said objective lens has a first magnetic lens.

37. The apparatus according to claim 36, wherein said first field lens has a second magnetic lens which is configured to cancel rotation variations of said plurality of slow-secondary electron spots in said SSE mode when observing said surface in different conditions.

38. The apparatus according to claim 36, wherein said second field lens has a third magnetic lens which is configured to cancel rotation variations of said plurality of backscattered-electron spots in said BSE mode when observing said surface in different conditions.

39. The apparatus according to claim 36, wherein said zoom lens has a second magnetic lens which is configured to cancel rotation variations of said plurality of slow-secondary-electron spots in said SSE mode and said plurality of backscattered-electron spots in said BSE mode respectively when observing said surface in different conditions.

40. The apparatus according to claim 36, wherein said projection lens has a second magnetic lens which is configured to cancel rotation variations of said plurality of slow-secondary electron spots in said SSE mode and said plurality of backscattered-electron spots in said BSE mode respectively when observing said surface in different conditions.

41. The apparatus according to claim 40, wherein said secondary projection imaging system comprises an alignment deflector, which is configured to compensate deviations of said SSE corresponding relationship and said BSE corresponding relationship respectively due to manufacturing and/or assembly errors of said detection unit.

42. A method to configure a detection system of a multi-beam apparatus for observing a surface of a sample, comprising steps of:
deflecting, by a beam separator, a plurality of secondary electron beams generated by a plurality of probe spots on said surface to travel along a secondary optical axis of said apparatus;
focusing, by a zoom lens, said plurality of secondary electron beams onto a transfer plane, wherein said zoom lens is aligned with said secondary optical axis;
focusing, by a projection lens, said plurality of secondary electron beams from said transfer plane onto a detection plane to form a plurality of secondary-electron spots thereon, wherein said projection lens is aligned with said secondary optical axis;
detecting, by an electron detection device with a plurality of detection elements, said plurality of secondary-electron spots respectively, wherein said plurality of detection elements is placed on said detection plane;
deflecting, by an anti-scanning deflection unit, said plurality of secondary electron beams in step with said plurality of probe spots scanning over a plurality of scanned regions on said surface to keep positions of said plurality of secondary-electron spots all the time; and
adjusting said zoom lens and said projection lens to cancel radial and rotational variations of positions of said plurality of secondary-electron spots when observing said surface in different conditions.

43. The method according to claim 42, further comprising a step of cutting off, by a secondary beam-limit aperture, peripheral electrons of said plurality of secondary electron beams.

44. The method according to claim 42, further comprising a step of reducing, by a field lens, off-axis aberrations of said plurality of secondary-electron spots.

45. The method according to claim 42, further comprising a step of compensating, by a stigmator, astigmatism aberrations of said plurality of secondary-electron spots due to said beam separator.

46. The method according to claim 42, further comprising a step of compensating, by an alignment deflector, a shift between said plurality of secondary-electron spots and said plurality of detection elements due to manufacturing and/or assembly errors of said detection unit.

47. A method to configure a detection system of a multi-beam apparatus for observing a surface of a sample, comprising steps of:
operating the detection system in a SSE mode, which comprises sub-steps of:
deflecting, by a beam separator, a plurality of slow secondary electron beams generated by a plurality of probe spots on said surface to travel along a secondary optical axis of said apparatus;
focusing, by a zoom lens aligned with said secondary optical axis, said plurality of slow secondary electron beams onto a first transfer plane;
bending, by a first field lens aligned with said secondary optical axis and placed at said first transfer plane, said plurality of slow secondary electron beams;
focusing, by a projection lens aligned with said secondary optical axis, said plurality of secondary electron beams onto a detection plane to form a SSE crossover therebetween and a plurality of slow-secondary-electron spots thereon;
detecting, by an electron detection device with a plurality of detection elements, said plurality of slow-secondary-electron spots respectively, wherein said plurality of detection elements is placed on said detection plane;
deflecting, by an anti-scanning deflection unit, said plurality of slow secondary electron beams in step with said plurality of probe spots scanning over a plurality of scanned regions on said surface to keep positions of said plurality of slow-secondary-electron spots all the time; and
adjusting said zoom lens and said projection lens to cancel radial and rotational variations of positions of said plurality of slow-secondary-electron spots respectively when observing said surface in different conditions; and
operating the detection system in a BSE mode, which comprises sub-steps of:
deflecting, by said beam separator, a plurality of backscattered electron beams generated by said plurality of probe spots on said surface to travel along said secondary optical axis of said apparatus;
focusing, by said zoom lens, said plurality of backscattered electron beams onto a second transfer plane;
bending, by a second field lens aligned with said secondary optical axis and placed at said second transfer plane, said plurality of backscattered electron beams;
focusing, by said projection lens, said plurality of backscattered electron beams onto said detection plane to form a BSE crossover therebetween and a plurality of backscattered-electron spots thereon;
detecting, by said plurality of detection elements, said plurality of backscattered-electron spots respectively;
deflecting, by said anti-scanning deflection unit, said plurality of backscattered electron beams in step with said plurality of probe spots scanning over said plurality of scanned regions to keep positions of said plurality of backscattered-electron spots all the time; and
adjusting said zoom lens and said projection lens to cancel radial and rotational variations of positions of said plurality of backscattered-electron spots respectively when observing said surface in different conditions.

48. The method according to claim 47, wherein said step of operating the defection system in said SSE mode comprises a sub-step of cutting off, by a first secondary beam-limit aperture at said SSE crossover, peripheral electrons of said plurality of slow secondary electron beams.

49. The method according to claim 48, wherein said step of operating the detection system in said BSE mode comprises a sub-step of cutting off, by a second secondary beam-limit aperture at said BSE crossover, peripheral electrons of said plurality of backscattered electron beams.

50. The method according to claim 49, wherein said SSE crossover and said BSE crossover are at or close to a same place.

51. The method according to claim 50, wherein said step of operating the detection system in said SSE mode comprises a sub-step of compensating, by a stigmator placed close to said same place, astigmatism aberrations of said plurality of slow-secondary-electron spots due to said beam separator.

52. The method according to claim 51, wherein said step of operating the detection system in said BSE mode comprises a sub-step of compensating, by said stigmator, astigmatism aberrations of said plurality of backscattered-electron spots due to said beam separator.

53. The method according to claim 52, wherein said step of operating the detection system in said SSE mode comprises a sub-step of compensating, by an alignment deflector, a shift between said plurality of slow-secondary-electron spots and said plurality of detection elements due to manufacturing and/or assembly errors of said detection unit.

54. The method according to claim 53, wherein said step of operating the detection system in said BSE mode comprises a sub-step of compensating, by said alignment deflector, a shift between said plurality of backscattered-electron spots and said plurality of detection elements due to manufacturing and/or assembly errors of said detection unit.

55. An imaging system for a detection device in a multi-beam apparatus, comprising:
a zoom lens and a projection lens configured to focus a plurality of charged particle beams emanated from a sample surface to a plurality of detection elements of the detection device respectively; and
an electrostatic lens and a magnetic lens configured to cancel rotation of the plurality of charged particle beams induced by a magnetic objective lens in the multi-beam apparatus.

56. The imaging system according to claim 55, further comprising deflectors configured to cancel scanning of the plurality of charged particle beams on the detection device, which is induced by a deflection scanning unit in the multi-beam apparatus.

57. The imaging system according to claim 55, wherein the plurality of charged particle beams includes a plurality of slow secondary electron beams and a plurality of backscattered electron beams.

58. The imaging system according to claim 55, wherein the detection device is a semiconductor diode detector.

59. The imaging system according to claim 56, wherein the deflectors are located close to an entrance side of the imaging system.

60. The imaging system according to claim 56, wherein the deflectors include a first deflector and a second deflector in sequence along an optical axis of the imaging system.

61. The imaging system according to claim 56, wherein the zoom lens and the projecting lens are located in sequence along an optical axis of the imaging system.

62. The imaging system according to claim 61, wherein the magnetic objective lens and the zoom lens are configured to focus the plurality of charged particle beams into a transfer plane; and the projecting lens is configured to focus the plurality of charged particle beams from the transfer plane into a detection plane on the detection device.

63. The imaging system according to claim 62, wherein the zoom lens includes a first electrostatic lens and a second electrostatic lens in sequence along the optical axis.

64. The imaging system according to claim 62, wherein the deflectors are located between the first electrostatic lens and a second electrostatic lens.

65. The imaging system according to claim 63, wherein the zoom lens includes a magnetic lens.

66. The imaging system according to claim 62, wherein the projecting lens includes an electrostatic lens and a magnetic lens.

67. The imaging system according to claim 62, further comprising a field lens at the transfer plane for reducing aberration of the plurality of charged particle beams.

68. The imaging system according to claim 67, wherein the field lens includes an electrostatic lens.

69. The imaging system according to claim 68, wherein the field lens includes a magnetic lens.

70. The imaging system according to claim 62, further comprising a plate with at least one opening, one opening of the plate being as a beam-limit aperture for reducing sizes of the plurality of charged particle beams on the detection device.

71. The imaging system according to claim 70, wherein the plate includes a plurality of selectable openings with different sizes.

72. The imaging system according to claim 70, wherein the plate is located at a crossover of the plurality of charged particle beams between the projecting lens and the detection device.

73. The imaging system according to claim 62, further comprising a stigmator for reducing astigmatism of the plurality of charged particle beams.

74. The imaging system according to claim 73, wherein the stigmator is located at a crossover of the plurality of charged particle beams.

75. The imaging system according to claim 62, further comprising an alignment deflector for aligning the plurality of charged particle beams with a plurality of detection elements of the detection device respectively.

76. The imaging system according to claim 75, wherein the alignment deflector is located between the detection device and the projecting lens.

* * * * *